(12) United States Patent
Battlogg

(10) Patent No.: US 11,966,523 B2
(45) Date of Patent: Apr. 23, 2024

(54) OPERATING DEVICE AND METHOD FOR OPERATING AN OPERATING DEVICE

(71) Applicant: INVENTUS Engineering GmbH, St. Anton i.M. (AT)

(72) Inventor: Stefan Battlogg, St. Anton i.M. (AT)

(73) Assignee: INVENTUS Engineering GmbH, St. Anton i.M. (AT)

( * ) Notice: Subject to any disclaimer, the term of this patent is extended or adjusted under 35 U.S.C. 154(b) by 42 days.

(21) Appl. No.: 17/787,967

(22) PCT Filed: Feb. 15, 2021

(86) PCT No.: PCT/EP2021/053687
§ 371 (c)(1),
(2) Date: Jun. 22, 2022

(87) PCT Pub. No.: WO2021/160895
PCT Pub. Date: Aug. 19, 2021

(65) Prior Publication Data
US 2023/0031876 A1 Feb. 2, 2023

(30) Foreign Application Priority Data

Feb. 14, 2020 (DE) ............. 10 2020 104 011.3
Feb. 21, 2020 (DE) ............. 10 2020 104 705.3
Jun. 26, 2020 (DE) ............. 10 2020 116 941.8

(51) Int. Cl.
*G06F 3/0362* (2013.01)
*B60K 37/06* (2006.01)
(Continued)

(52) U.S. Cl.
CPC ............ *G06F 3/0362* (2013.01); *B60K 37/06* (2013.01); *F16D 57/002* (2013.01); *F16F 9/535* (2013.01);
(Continued)

(58) Field of Classification Search
CPC ...... G06F 3/016; G06F 1/1632; G06F 3/0362; G06F 1/1684; G06F 2200/1633;
(Continued)

(56) References Cited

U.S. PATENT DOCUMENTS 10,976,827 B2   4/2021   Battlogg
11,231,780 B2   1/2022   Battlogg
(Continued)

FOREIGN PATENT DOCUMENTS

EP      3317749 A1    5/2018
WO   2017001696 A1    1/2017
(Continued)

*Primary Examiner* — Hang Lin
(74) *Attorney, Agent, or Firm* — Laurence A. Greenberg; Werner H. Stemer; Ralph E. Locher

(57) ABSTRACT

An apparatus for carrying out inputs in an input capturing unit that can be coupled to the apparatus. An operating device has a receiving part and an operating element that is rotatably mounted on the receiving part. The operating element can be rotated by a finger to effect an input. A torque for the rotation of the control element can be adjusted by way of a controllable braking device. In addition, the control element has at least two actuating zones. The resistance to movement for the movability of the operating element can be adjusted depending on from which actuation zone the operating element is actuated and/or which actuation zone was previously activated.

22 Claims, 9 Drawing Sheets

(51) Int. Cl.
    *F16D 57/00*     (2006.01)
    *F16F 9/53*     (2006.01)
    *G05G 5/03*     (2008.04)
    *G05G 9/04*     (2006.01)
    *G05G 25/00*     (2006.01)
    *G06F 3/01*     (2006.01)
    *G08B 7/06*     (2006.01)
    *H04B 1/3888*     (2015.01)
    *H04M 1/04*     (2006.01)
    *H04M 1/72409*     (2021.01)

(52) U.S. Cl.
    CPC .................. *G05G 5/03* (2013.01); *G05G 9/04* (2013.01); *G05G 25/00* (2013.01); *G06F 3/016* (2013.01); *G08B 7/06* (2013.01); *H04B 1/3888* (2013.01); *H04M 1/04* (2013.01); *H04M 1/724092* (2022.02); *B60K 2370/126* (2019.05); *B60K 2370/1446* (2019.05); *G05G 2505/00* (2013.01)

(58) Field of Classification Search
    CPC .... H04B 1/3888; H04M 1/236; H04M 1/233; H04M 1/04; H04M 1/185; H04M 1/724092; G05G 25/00; G05G 9/04; G05G 5/03; G05G 1/08; G05G 2505/00; G08B 7/06; H01H 19/14; H01H 25/008; H01H 19/11; A45C 11/00; A45C 2011/002; A45C 2011/003; A45C 19/003; A45C 2019/146; A45C 2003/008; H03K 17/97; H03K 2217/94068; F16F 9/535; F16D 57/002; B60K 37/06; B60K 2370/126; B60K 2370/1446

See application file for complete search history.

(56) References Cited

U.S. PATENT DOCUMENTS

| | | | |
|---|---|---|---|
| 2006/0033703 A1 | 2/2006 | Olien et al. | |
| 2013/0124642 A1* | 5/2013 | Bansal | H04L 12/12 709/206 |
| 2018/0111273 A1 | 4/2018 | Linnell et al. | |
| 2018/0298959 A1* | 10/2018 | Battlogg | F16D 57/002 |
| 2019/0079717 A1* | 3/2019 | Lee | B60K 37/06 |

FOREIGN PATENT DOCUMENTS

| | | |
|---|---|---|
| WO | 2018215350 A1 | 11/2018 |
| WO | 2019148505 A1 | 8/2019 |

\* cited by examiner

OPERATING DEVICE AND METHOD FOR OPERATING AN OPERATING DEVICE

FIELD AND BACKGROUND OF THE INVENTION

The present invention relates to an operating device for carrying out inputs in an input receiving unit that can be coupled to the operating device. The operating device comprises at least one operating unit having at least one receptacle part and at least one operating element movably mounted on the receptacle part. The operating element can be moved by rotation by means of at least one finger to carry out an input. A movement resistance for the mobility of the operating element is deliberately settable by means of at least one controllable brake unit.

Such an operating device is known, for example, from WO 2018 215 350 A1. The rotational movement can be influenced therein using a magnetorheological brake unit, so that stops or rasters and other haptically perceptible signals can be generated, for example. The operating device described therein functions and permits the transmission of quite high forces or torques with a relatively small structural form at the same time.

Such operating devices are used, for example, in the operation of technical devices, for example, in vehicles, aircraft or airplanes, ships, boats, agricultural technology (tractors, combine harvesters, harvesting machines, other field machines for agriculture), self-propelled working machines or construction machines, and industrial trucks (forklifts, etc.) or also in medical or industrial facilities. Possible uses moreover result in the operation of domestic appliances (washing machines, etc.), radios, photographic apparatuses and cameras, hi-fi and television systems, smart devices, smart home devices, notebooks, PCs, smart watches. The operating unit can also be used in a crown gear of a wristwatch or as a rotating wheel or mouse wheel in a computer mouse or other devices.

The operating unit is used more and more frequently in motor vehicles, for example, to select menus or perform user inputs. In this case, by rotating the rotating knob, for example, various functions of a menu for infotainment (for example volume) or climate control (for example temperature) or comfort electronics (for example seat position) or the like can be actuated.

In order that different functions or menus can be actuated, the operating units generally require still further operating parts or switches in addition to the rotating knob. However, the operation can thus become less clear and lengthen inspection. This is undesirable in particular in the case of machines and vehicles, which require a high level of concentration of the operator.

Operating units have therefore become known, the rotating knob of which can also be pushed and/or pulled. The function level or the menu can thus be changed by pushing, for example.

SUMMARY OF THE INVENTION

In contrast, it is the object of the present invention to provide an operating device having improved options for carrying out inputs. In particular, different inputs are to be possible without the user being increasingly distracted for this purpose. Overall, the functionality and usability and also the operating convenience or the ergonomics are to be improved. However, the installation space required is to be kept as small as possible. Furthermore, a design is desirable which can be manufactured simply and cost-effectively and at the same time is robust and enables reliable operation.

This object is achieved by an operating device having the features as claimed and by a method having the features as claimed. A vehicle component according to the invention is the subject of a further claim. Preferred refinements of the invention are the subject matter of the dependent claims. Further advantages and features of the present invention result from the general description and the description of the exemplary embodiments.

The operating device according to the invention is used to carry out inputs in an input receiving unit that can be coupled (or is coupled) to the operating device. The operating device comprises at least one operating unit having at least one receptacle part and at least one operating element mounted movably (in particular rotatably) on the receptacle part. The operating element can be moved (in particular rotated) in particular by means of at least one finger (and thus also by a thumb) to carry out an input. A movement resistance for the mobility of the operating element is settable by means of at least one controllable brake unit. The operating element comprises at least two actuating zones. The operating element can also comprise three or four or five or more actuating zones. The movement resistance for the mobility of the operating element is settable by means of the controllable brake unit in dependence on the actuating zone from which the operating element is actuated (in particular moved or rotated) and/or which actuating zone was previously activated (for example by pressing on the actuating zone).

The operating device according to the invention offers many advantages. The operating element is particularly advantageous with its (in particular different) actuating zones, which can deliberately be braked or released using the (in particular magnetorheological) brake unit. Depending on which zone is used (for example touched), a specific movement resistance or torque is set for the rotational movement. Moreover, it is particularly advantageous that only one operating element is required for this purpose. Versatile and simultaneously intuitive operating options can thus be implemented in a particularly compact, ergonomic, and simultaneously simply designed manner.

Overall, the invention has the advantage that different functions and menus can be activated without still further operating parts or switches being required in addition to the operating element. A change between various menus can thus take place without searching for the switches and, for example, solely haptically by simply displacing a finger. Various functions are also activatable without releasing the operating element. During the operation using the invention, the user is distracted significantly less and can concentrate better on his actual task, which is a significant advantage in particular when driving vehicles.

Moreover, an improvement of the productivity and a reduction of the frequency of errors by the user can be achieved by haptic feedback. A further particular advantage is the silent actuation, since no mechanical rasters or the like are required. Moreover, if needed noises or even tones can also be generated by corresponding activations of the brake unit during the rotation, however.

In all embodiments, the movement resistance for the mobility of the operating element is preferably a torque for the rotatability of the operating element and/or a moment for a linear mobility of the operating element. In particular, the operating element is rotatable and/or linearly movable (displaceable). In particular, in the scope of the present invention, the term "movement resistance" can be replaced by "torque" or "moment" or the term "rotatable" or "rotatability" can be replaced by "movable" or "mobility" (if reasonable).

The brake unit is preferably designed as magnetorheological. In particular, the brake unit comprises at least one magnetorheological medium and at least one field generating unit for generating a magnetic field and in particular also for controlling a magnetic and/or electrical field strength. In particular, the medium is influenceable by means of the field generating unit in order to set the movement resistance (in particular the torque and/or moment) for the rotatability of the operating element. Particularly detailed haptic feedback can be generated using a magnetorheological brake unit.

The actuating zones are preferably connected to one another in a fixed (in particular rotationally fixed) manner. In particular, the actuating zones have a common movement axis (in particular axis of rotation). In particular, the actuating zones are only jointly movable (in particular rotatable and/or linearly displaceable). In particular, all actuating zones of the operating element are moved when the operating element is moved. In particular, the actuating zones are not movable independently of one another. The actuating zones can be connected to one another in a fixed manner (in particular so they are not nondestructively detachable). In particular, the actuating zones are integrally connected to one another. In particular, the actuating zones are rotatably mounted on a common axis. In particular, the actuating zones are connected to one another in a fixed manner. In particular, the actuating zones are situated axially adjacent to one another. In particular, the actuating zones are arranged in succession in the longitudinal direction of the operating element or along the axis of rotation. In particular, the actuating zones correspond to axial sections of the operating element. In particular, at least one common brake unit is provided for the actuating zones. In particular, the actuating zones are only damped via a single magnetorheological brake unit. In particular, the actuating zones are mounted on a common axis. This offers an implementation of the invention which is particularly simply designed and is to be manufactured cost-effectively.

In particular, the brake unit and the operating element (in particular also the actuating zones) are rotatable around a common axis of rotation. The operating element and the brake unit are particularly preferably mounted on a common axis. The brake unit can also be rotatable around an axis of rotation which is arranged in parallel or transversely to the axis of rotation of the operating element. In particular, the operating element and the brake unit are then each rotatably mounted around one axis.

The brake unit can be coupled to the operating element by means of at least one transmission unit. The transmission unit can be used for the step-up or step-down transmission or passing on of a speed of the operating element in relation to the brake unit. For example, a higher (braking) torque can be achieved by the transmission unit. The transmission unit can be used to connect axes of rotation of operating element and brake unit which are arranged offset in parallel or transversely in relation to one another. The brake unit can thus be arranged offset in relation to the axis of rotation of the operating element, for example, to use the installation space better.

In particular, the actuating zones are arranged axially directly or indirectly adjacent to one another. The axial arrangement relates in particular to an axis of rotation of the operating element and/or the brake unit. For example, the actuating zones are axial sections of the operating element or comprise such sections.

In all embodiments, it is particularly preferred that the movement resistance is settable in dependence on at least one rotational angle of the operating element detected by means of at least one sensor unit. In particular, the movement resistance is deliberately adapted in dependence on the rotational angle. In particular, the movement resistance is dynamically adapted in dependence on the rotational angle. The change of the torque of the rotating operating element in particular results directly in a change of the required tangential force for rotating the operating element and thus the force at the finger or at the fingers (finger force). This force change at the finger or at the fingers is perceived by the user as force feedback.

In advantageous embodiments, it is preferred that the sensor unit comprises at least one sensor (e.g., encoder, rotary encoder, Hall encoder . . . ). The sensor is, for example, an angle sensor and in particular a rotational angle sensor. An absolute position (for example absolute value encoder) or relative position can be detectable. The sensor can detect the angle of the operating element directly or also indirectly via a position of another component and in particular of the brake unit. For example, for this purpose an angle position and/or a rotational angle of the brake unit or also of the operating element itself is detected. The detected angle is preferably provided to the control unit for the activation of the brake unit.

The operating device preferably comprises at least one monitoring unit. The monitoring unit preferably comprises at least one proximity recognition unit or is designed as such. Other types of monitoring are also possible. In particular, the monitoring unit, preferably the proximity recognition unit, is suitable and designed to detect sensorially from which actuating zone the actuation takes place. In particular, the monitoring unit is suitable and designed to detect sensorially in which actuating zone an actuation takes place. In particular, a rotational movement of the operating element is assigned to that actuating zone which was recognized by the monitoring unit and in particular the proximity recognition unit as that actuating zone from which the actuation took place. The monitoring unit comprises in particular at least one image recognition sensor and/or proximity sensor and/or close range sensor and/or contact sensor and/or radar sensor and/or at least one camera unit and/or at least one capacitive sensor. In particular, at least one sensor of the monitoring unit is assigned to each of the actuating zones.

In one particularly advantageous and preferred embodiment, the monitoring unit is suitable and designed to detect and in particular also to recognize gestures. In particular, the monitoring unit comprises at least one gesture recognition unit. In particular, at least one gesture recognition zone extends for this purpose at least around the operating element. In particular, the monitoring unit is suitable and designed to recognize at least one gesture executed in the region of the gesture recognition zone and to execute at least one input or function in dependence on the gesture. In particular, the gesture recognition unit comprises at least one radar sensor and/or at least one camera unit and/or at least one other type of sensor for gesture recognition. It is possible that at least one actuating zone is activatable by means of at least one gesture.

It is also preferred and advantageous that the actuating zones are each activatable and in particular also deactivatable by a touch and/or a press. For example, a rotational movement of the operating element is assigned to that actuating zone which was previously touched and/or pressed at least once. It is possible that for this purpose a detection, in particular a measurement, of a pressure intensity takes place. In particular, the actuating zones are activatable in dependence on the pressure intensity. In particular, at least one pressure sensor is assigned to each of the actuating zones.

The actuating zones are preferably haptically and/or optically distinguishable. In particular, haptic distinguishing is already possible without a rotational movement of the operating element. In particular, the actuating zones each have a different surface (for example, shape: transverse grooves, longitudinal grooves; knurling . . . ; for example, material: plastic, glass, metal, chromed, gilded . . . ) and/or size and/or geometry (for example, crowned, concave, convex . . . ) and/or color and/or illumination. For example, the surfaces differ in their roughness or rawness and/or in their diameter and/or in their external contour and/or surface structure. It is possible that one actuating zone protrudes or is recessed in relation to the other actuating zone. It is also possible that the actuating zones are at least partially enclosed with different circumferential angles in the receptacle part and/or protrude out of the receptacle part or are exposed.

In one advantageous embodiment, the actuating zones can be at least partially illuminated and preferably can be illuminated differently. In particular, the actuating zones can be illuminated in such a way that they are optically distinguishable by the illumination. In particular, an active actuating zone (or an actuating zone which was activated) can be illuminated differently from the at least one other (inactive) actuating zone. An illumination is in particular also understood as a representation on a display. In particular, the actuating zones are distinguishable by the display.

The operating device can in particular be coupled to a telecommunication unit. In particular, the telecommunication unit is at least partially operable using the operating unit. In particular, at least one of the actuating zones can be illuminated in dependence on an incoming call. In particular, the call can be accepted and/or rejected at least using the illuminated actuating zone. The operating device can comprise a telecommunication unit. The actuating zone for accepting the call can also be indicated by an adjacent display in dependence on an incoming call. It is also possible that at least one of the actuating zones can be illuminated in dependence on another function.

Two or more actuating zones can also be able to be illuminated in dependence on an incoming call. The actuating zones can in particular be illuminated differently here. In particular, different inputs for the telecommunication unit and preferably with respect to the incoming call are possible using the differently illuminated actuating zones. For example, the call can be accepted using an actuating zone illuminated green and can be rejected using an actuating zone illuminated red. During a conversation, at least one actuating zone (for example, the one which was previously used to accept the call) can be provided for ending and/or for volume adjustment and can be illuminated red or yellow for this purpose, for example. A call is also understood as a message (for example, SMS or the like).

In all embodiments, it is preferred and advantageous that the actuating zones are haptically and/or optically and/or acoustically distinguishable in dependence on their (present) assignment. An assignment of an actuating zone in particular means which function can (presently) be operated using this actuating zone or which input can (presently) be carried out thereby. For the haptic distinguishing, in particular a defined torque for the rotatability of the operating element and preferably a haptic signal is settable. For the optical distinguishing, in particular a different illumination is settable for the actuating zones and/or at least one display. In particular, the movement resistance for the rotatability of the operating element is settable in dependence on the (present) assignment of at least one of the actuating zones.

The operating device in particular comprises at least one control unit. The control unit is in particular suitable and designed for the purpose of activating the brake unit at least in dependence on at least one control command and in particular converting the control command into at least one haptic signal (force feedback) perceptible at the operating element. The haptic signal in particular comprises a defined sequence of deceleration torques or is designed as such a sequence. This takes place in particular in such a way that a user can receive or receives at least one haptic feedback (so-called force feedback) at the operating element as a consequence of a performed input and/or during an input. In particular, the rotatability of the operating element is subjected to a deceleration torque in order to provide haptic feedback. The haptic signal in particular comprises a defined sequence of deceleration torques or is designed as such a sequence. In particular, a haptic signal is understood as a significant (and in particular perceptible) change of the rotational resistance.

Specific inputs can thus be associated with matching haptic feedbacks, by which the user can infer solely from the feedback what he has set or which function he is executing or adjusting. A further particular advantage of the invention is thus that not only inputs from the user to the input receiving unit, but also haptic feedback from the input receiving unit can take place via the operating element to the user. The operating device having the manually tangible operating element permits a very direct (preferably in quasi-real-time) and immediate feedback tangible using the finger or fingers. A very accurate control can thus be carried out. Due to the direct contact with one or more fingers of the hand, which can also be provided with a glove, a sensitive and intuitive control is possible. If, for example, the user selects a sensitive or even critical function using the operating element, the user thus receives a different, clearly assignable force feedback for this purpose than for a standard function. This can be a strongly increased torque, but also a torque ripple with subsequent brief high torque and subsequent rotating beyond this at lower torque and subsequent barrier (blocking or stop or very high torque).

In all embodiments, it is possible that the operating device comprises at least one display. In particular, the display is used to indicate a (present) function assignment of the actuating zones. This offers a convenient assistance of the haptic feedback.

The control command specifies in particular which deceleration torque is to be set at which rotational angle and/or at which time. The control command can comprise at least one function which describes a torque curve over the rotational angle and/or over the time. The control command can contain items of information about how such a function is to be dynamically adapted.

The control command is provided in particular by the input receiving unit and/or by the control unit. The input receiving unit and/or the control unit can in particular generate a plurality of different control commands or can deliberately select one control command from a plurality of stored control commands. The operating device can be coupled to the input receiving unit in a wireless and/or wired manner. The input receiving unit is made available in particular by the device to be operated and, for example, by a motor vehicle or a machine. The input receiving unit can comprise a computing unit (in particular a microcontroller, computer, mobile terminal, etc.) or can be designed as such. The assignment of the actuating zones is in particular settable fixedly and/or dynamically in dependence on the input or the control command.

In one particularly preferred and advantageous refinement, haptic feedback takes place in dependence on the actuating zone in which the operating element is actuated and in particular touched. For example, upon a rotation of the operating element at a first actuating zone, a higher frequency is set for the sequence of deceleration torques than upon a rotation of the operating element at the other actuating zone. This has the advantage that the user can recognize without visual contact which inputs he has just performed. In particular, such haptic feedback also takes place in dependence on a control command of the input receiving unit.

It is also preferred and advantageous that depending on the actuated and/or active actuation zone, a specific input takes place. The assignment of actuating zone and input is preferably programmable and/or dynamically adaptable. The assignment can also be carried out by a control command from the input receiving unit. In particular, the control unit of the operating device is suitable and designed to transmit at least one separate input in each case for each actuating zone to the input receiving unit. Thus, for example, two or more individual operating knobs can be simulated using only one operating element. In particular, the control unit is suitable and designed to provide an input signal to the input receiving unit for each actuating zone.

It is possible that the actuating zones are each suitable and designed for operating at least one specific function of the input receiving unit that can be coupled to the operating device, so that a different function of the input receiving unit is activatable depending on the actuated actuating zone. A function is also understood according to the invention as an operation of a program running on the input receiving unit or software stored on the input receiving unit and/or an operation via a network.

The rotational movement of the operating element (for example, in the case of scrolling) can be subjected to a settable raster. The raster is preferably generated by deliberate deceleration (in particular higher torque) and/or blocking (in particular high torque) and a deliberate release of the rotational movement (in particular low torque) at specific time intervals and/or at specific rotational angles. The raster (ripple) is preferably also set in dependence on the actuating zone from which the actuating element is actuated and in particular rotated.

In particular, a different frequency for the sequence of deceleration torques is set in dependence on the respective actuating zone. Depending on the raster, a different implementation of the input at the computing unit also takes place in particular, for example, a faster or slower skipping of scrolling or the like. The scrolling takes place in particular by means of a rotational movement of the input element.

The operating device comprises in particular at least one arrangement of the operating element optimized for right-handed people. The operating device comprises in particular at least one arrangement of the operating element optimized for left-handed people. For example, an operating element which is provided for actuation using the thumbs is arranged on the left or on the left-hand side in the arrangement optimized for right-handed people. For example, an operating element which is provided for actuation using the thumbs, is arranged on the right or the right-hand side in the arrangement optimized for left-handed people. In particular, the invention comprises an operating device having a receptacle part having the arrangement optimized for right-handed people and an operating device having a receptacle part having the arrangement optimized for left-handed people. It is also possible that the operating element can optionally be arranged on the receptacle part in the arrangement optimized for right-handed people and the arrangement optimized for left-handed people. A tool-free conversion of the operating element on the receptacle part is preferably provided. The operating device preferably recognizes independently whether the user is right-handed or left-handed and switches over the arrangement and the haptic behavior accordingly. The recognition can preferably take place via the monitoring unit and in particular the close-range recognition unit. The user can thus change over easily and conveniently from right-handed operation to left-handed operation, which is advantageous for the muscles, joints, and tendons upon longer use.

In all embodiments, it is particularly preferred that the rotatability of the operating element is settable by means of the brake unit from freely rotatable (so-called freewheeling; free spinning or low torque) to completely blocked for the force which can be manually generated that occurs in operation of the operating element (in particular high torque). Blocking is understood in particular as such a high deceleration torque that no movement of the operating element is possible using the intended finger or hand forces to be expected. In particular, another actuation of the operating element then first has to take place to cancel the blocking (for example, pressing).

It is possible and preferred that the operating element can be pushed and/or pulled to carry out an input. In particular, the operating element is designed so it can be pushed and/or pulled. In particular, the operating element can be pushed and/or pulled transversely to the axis of rotation. It is also possible that the operating element can be pushed and/or pulled along the axis of rotation. It is possible that no damping by the (magnetorheological) brake unit takes place for the pushing movement and/or pulling movement. However, it is also possible that the pushing movement and/or pulling movement can be deliberately damped by means of the brake unit and/or by means of at least one further (magnetorheological) brake unit. During the pushing movement, the rotational movement of the operating element can automatically be set more sluggishly or even blocked (high torque), by which inadvertent rotation during the pushing is prevented. It is possible that in such an embodiment, a detection, in particular measurement, of a pushing intensity takes place. In particular, the input is then carried out in dependence on the pushing intensity. Another input can take place or another function can be settable depending on the pushing intensity.

In one advantageous refinement, the operating element is designed as a rocker. In particular, the operating element comprises at least one rocker bearing. In particular, the rocker bearing is arranged between at least two actuating zones. In particular, the operating element can be tilted to both sides of the rocker bearing to carry out an input. In particular, a specific input and/or specific haptic feedback takes place depending on the pushed and/or pulled actuating zone. Damping by means of the brake unit can be provided or not for the pushing and/or pulling. In particular, the rocker bearing has a pivot axis which is arranged transversely to the axis of rotation of the operating element. The actuating zone can also be axially displaced. The displacement directions can be associated with various commands (inputs).

It is also possible that the monitoring unit is suitable and designed to recognize at which of the actuating zones the operating element is pushed and/or pulled. An input and/or haptic feedback then takes place in particular in dependence on the actuating zone at which the operating element is or was pushed and/or pulled.

It is possible and advantageous that the operating device comprises at least one pivotable operating lever. In particular, the operating lever is a control stalk for a motor vehicle. In particular, the operating unit, preferably the receptacle part, is attached to the operating lever and in particular fastened thereon. At least one, preferably at least two or three or more operating units can be arranged on the operating lever. The receptacle part is preferably attached to the operating lever in such a way that the operating element is movable independently of the operating lever and the operating unit is moved along upon pivoting of the operating lever. The longitudinal axis of the operating lever can be parallel or transverse to the axis of rotation of the operating element.

The operating device can also comprise a fixed or immobile operating lever, on which the at least one operating unit is attached. It is possible that the control stalk is designed as fixed or immobile. The operating processes or inputs which are otherwise carried out using a movement of the operating lever or control stalk are then at least partially taken over by the operating unit.

It is also possible and advantageous that the operating unit is arranged on a steering wheel and/or on a cockpit unit and in particular is integrated therein. The operating unit is designed here so that the operating processes or inputs which are otherwise carried out using a movement of the operating lever or control stalk are executable at least partially by the operating unit. The control stalk can thus be dispensed with entirely. For example, an operating unit, which activates the turn signals and the light (for example, one actuating zone for each of the turn signals, one actuating zone for low beam/high beam; in particular haptically stored differently) is on the left side of the steering wheel or to the left on the steering wheel. An operating unit which controls the windshield wiper system is on the right side of the steering wheel or to the right on the steering wheel.

In all embodiments, it is possible and advantageous that the operating element is designed as a finger roller. A finger roller is also understood in particular as a thumb roller. Such a finger roller is provided in particular to be rotated using (only) one finger. In particular, a part of the circumference of the finger roller is arranged concealed, so that the finger roller cannot be grasped over its complete circumference. This offers many advantages for the installation of the operating unit. The finger roller can be mounted at one axial end or also at both axial ends.

It is also possible and advantageous in all embodiments that the operating element is designed as a rotating knob. The rotating knob is in particular provided to be rotated using at least two fingers. In particular, the circumference of the rotating knob is exposed, so that the rotating knob can be grasped over its full circumference. In particular, one axial end of the rotating knob is formed exposed.

In the scope of the present invention, an actuation with one finger is understood in particular also as an actuation with another body part and an indirect actuation, for example, using an aid such as a pen or the like.

The vehicle component according to the invention is used to carry out inputs in an input receiving unit of a motor vehicle that can be coupled to the vehicle component. The vehicle component comprises at least one operating unit as was described above for the operating device according to the invention. In particular, the receptacle part is mountable or mounted on a vehicle support structure. The vehicle component comprises in particular at least one vehicle support structure. The vehicle support structure can be provided, for example, by a steering wheel, a control stalk, a cockpit unit, and/or an operating lever for drive or transmission.

The vehicle component according to the invention also achieves the above-mentioned object particularly advantageously. In the scope of the present invention, it is possible that the term "operating device" can be replaced by the term "vehicle component".

In the vehicle component, the input receiving unit is provided, for example, by a transmission unit, vehicle drive unit, comfort electronics, safety unit, user information system, driver assistance system, communication unit.

Preferably, at least one input receiving unit from a group of input receiving units is operable using the operating unit, comprising: display, instruments, volume control, telephone or telecommunication system, driver assistance systems and in particular cruise control or adaptive cruise control, turn signals (left-right-tap), windshield wipers front and rear including interval and window cleaning, horn, vehicle lights exterior and interior (e.g., main headlights, rear fog light, auxiliary headlights . . . , interior illumination level and interior illumination colors) and other light functions, seat functions (for example, seat position, backrest inclination . . . ), mirror unit (outside mirror setting, etc.), sliding roof (in particular with haptically recognizable positions), flashing warning lights (in particular deliberately higher torque, so that it is not actuated inadvertently), starting and/or stopping system of the automobile, climate control functions, ventilation, window lifters, actuating unit for closing and/or opening the doors and/or vehicle hatches (in particular rear hatch).

The method according to the invention is used in particular to operate an operating device, in particular as described above. The method also particularly advantageously achieves the above-mentioned object. The method according to the invention can also be designed to operate the vehicle component.

In particular, an operating element is moved by at least one finger to carry out an input. A movement resistance for the mobility of the operating element is set in dependence on the actuating zone from which the operating element is actuated and/or which actuating zone was previously activated.

In particular, the operating device is suitable and designed to implement the method steps described in the scope of the invention by means of the control unit. Preferably, an assignment of the actuating zones is indicated by a haptic and/or optical and/or acoustic signal, so that it can be recognized by such a signal which function can be operated (in particular presently) using at least one specific actuating zone. The signal is preferably automatically displayed when an assignment is defined and/or changed. For example, in the event of an incoming call, an actuating zone is automatically assigned to accept the call. This actuating zone is then illuminated green, for example, or identified by a call symbol on a display assigned to the actuating zone. The call can then be accepted in a vehicle without the driver having to search and be distracted.

In particular, an operating element which is presently provided for carrying out an input is indicated by an optical signal. An actuating zone which is presently provided for carrying out an input is preferably indicated by an optical signal. In particular, the movement resistance for the mobility of the operating element is adapted, in particular automatically, to the presently provided performance of the input.

In particular, the method is used for the (easier) operation of the operating device or for operation simplification, in that a specification (input request) which is not generated by the user/operator can be converted to that effect in a simplified manner into an operator command, in that at least one of multiple actuating zones associated with the specification lights up (optical recognition) and after this associated actuating zone is touched by the user/operator, the haptic feedback upon actuation of the input device (actuating zone) adapts in accordance with this process.

This can run as follows, for example: first, a control command or the like solely comes from an input receiving device, for example, a telephone call. An LED (or a symbol in a display) at an actuating zone associated with the telephone or the call acceptance then lights up. The user thus knows precisely where he has to reach. The user then rotates the actuating zone and notices due to haptic feedback that, for example, he accepts the call (increased force) and after rotating further can change the volume, since the torque then increases. The distraction is thus minimal and the operator notices haptically whether he does something correctly or incorrectly.

In particular, the above-described procedure, in particular the optical signal, is also supplemented by an acoustic and/or haptic signal.

Preferably, a bidirectional communication takes place between the input receiving unit and the operating device. In particular, the operating device is also activatable by the input receiving unit and preferably vice versa. In particular, the input receiving unit can activate the brake unit directly or indirectly via the control unit and preferably specify and/or set a deceleration torque. For this purpose, in particular at least one algorithm and, for example, software or a driver or the like is stored in the input receiving unit.

The setting of the torque can also be referred to as damping. The set torque then in particular corresponds to a braking torque or damping torque. In the scope of the present invention, "braking" or damping is also understood as a deceleration (in particular increased braking torque) and possibly also blocking (in particular high braking torque).

A torque of zero is preferably settable (release of the rotational movement). In particular only the structurally required forces are then to be applied for the rotatability of the operating element. Releasing or a release is understood in particular as at least partial reduction of the damping (in particular reduction of the braking torque) and in particular cancellation of the damping (in particular no braking torque). Upon a complete release of the mobility of the operating element, the braking unit is in particular inactive. Preferably, upon a release, a magnetorheological medium is not influenced by a magnetic field actively generated by the brake unit. Upon a complete release, the operating element is in particular (very easily) freely rotatable (freewheeling; free spinning). In addition to a rotational movement, a push actuation and/or pull actuation can also be provided for the operating element.

It is possible and preferred that the mobility of the operating element is deliberately changed to provide a haptic confirmation of an input which has occurred (shortly) beforehand or during the input. In particular, the confirmation takes place in dependence on the actuating zone. Many different confirmations (feedback) can be executed by appropriate adaptation of the mobility. For example, the confirmation takes place by a type of vibration (for example, torque changing rapidly over time between low and high) and/or rattling of the operating element.

According to the invention, rattling is understood in particular as alternate blocking (in particular high braking torque) and release of the mobility (in particular low braking torque) of the input element during an actuation or input or during a movement. The blocking and release takes place at a high frequency. A higher frequency can be provided during vibrating than during rattling. For example, a frequency of at least 10 Hz or at least 50 Hz or at least 100 Hz or at least 1000 Hz or more is provided. It can be provided that different types of confirmations are provided depending on the level of the frequency.

The rotatability of the operating element can preferably be deliberately decelerated, in particular damped, and blocked and released by means of the brake unit. The operating element preferably also has at least one mobility transverse to the axis of rotation. For example, pushing and/or pulling of the operating element can be provided.

In all embodiments, it is particularly preferred that the mobility of the operating element can be or is set from freely movable to completely blocked. The mobility or rotatability is completely blocked in the scope of the present invention when a movement or rotation is not possible by a force which can be manually generated during operational use of the operating device. In particular, the brake unit is suitable and designed to apply a deceleration torque of at least 0.05 Nm and preferably at least 0.1 Nm or also at least 1 Nm and preferably at least 2 Nm or at least 5 Nm.

It is preferred that the mobility of the input element and in particular the rotatability of the operating element can be or is switched between freely rotatable and blocked at a frequency of at least 10 Hz and preferably at least 50 Hz. A frequency of at least 20 Hz or at least 30 Hz or at least 40 Hz is also possible. A frequency of at least 60 Hz or at least 80 Hz or at least 100 Hz can also be provided. Frequencies of at least 120 Hz or at least 200 Hz or at least Hz or more are also possible.

For the rotatability of the operating element, in particular at least 25 stop points and preferably at least 50 stop points can be set for one revolution in each case. At least 150 or at least 200 or at least 250 or at least 300 stop points are also possible. At least 350 or at least 400 stop points can also be provided. The minimum settable rotational angle between two stop points is in particular at most 20° and preferably at most 10° and particularly preferably at most 2°. The minimum settable rotational angle between two stop points can also be at most 1° or at most 0.5° or at most 0.1°.

The magnetorheological brake unit is preferably suitable and designed, in particular by means of a sensor, rotational encoder, or increment encoder, to provide at least 30 000 increments, in particular 60 000 increments/revolution, for a rotation of the operating element. Incremental encoders, for example, supply a specific number of pulses per revolution or also a so-called zero pulse per revolution. These can be increment encoders having UVW signals or absolute encoders. Haptic signals can thus be implemented particularly effectively. In particular, the increments are usable for the purpose of providing the above-described feedback and sequences. In particular, at least 30 000 increments can be provided per revolution of the brake unit. In particular, the sensor means can comprise at least 60 000 increments per revolution of the brake unit.

Preferably, the number of the stop points is set in dependence on the actuating zone. The number of the stop points can also be set in dependence on selection options, menu options, or a number of pages or tabs or the like. A stop point is provided in particular in that the rotatability of the operating element is at least temporarily deliberately decelerated and in particular blocked and subsequently released again.

It is possible and advantageous that a rotational angle between the stop points is settable in dependence on the actuating zone.

In particular, the rotational angle of the operating element is monitored by means of a sensor unit. The sensor unit is suitable and designed in particular to detect the rotational angle at a resolution of at least 1° and preferably at least 0.5° and particularly preferably at least 0.2° or also preferably at least 0.1°.

In all embodiments, it is particularly preferred that the mobility of the operating element can be or is adapted in real time. In particular, the brake unit is suitable and designed to change the deceleration by at least 30% within less than 100 ms. In particular, the deceleration is changeable by at least 10%, preferably by at least 30%, and particularly preferably by at least 50% within less than 10 ms. The deceleration can also be variable by at least 100% or 500% or by tenfold or a thousandfold within less than 100 ms. Such a real-time control is a particularly significant advantage for working with the operating device.

In particular, the control unit is suitable and designed to adapt a deceleration torque of the brake unit to deliberately damp the movement. In particular, the control unit is suitable and designed to dynamically and preferably adaptively set the deceleration torque.

The control unit can preferably set an arbitrary deceleration torque that can be generated using the brake unit for an arbitrary rotational angle achievable using the operating element and/or for a settable duration (in particular torque over rotational angle and time). In particular, the control unit comprises a plurality of settable operating modes and is preferably suitable and designed to perform an association of deceleration torque and rotational angle and/or duration in dependence on the operating mode and/or the control command.

The damping generated using the brake unit can in particular be deliberately adapted by means of the control unit. The control unit is in particular an electronic control unit. The control unit in particular comprises at least one control algorithm. In particular, the setting of a deceleration torque is carried out by activating an electrical coil unit of the brake unit using a specific current and/or a specific voltage or a suitable signal. The increasing and/or decreasing of the deceleration torque can take place continuously or variably (over the time and/or the angle) in all embodiments.

In one particularly advantageous embodiment, the control unit is suitable and designed to decelerate and release the movement of the operating element by means of the brake unit in a deliberate sequence. To implement such a sequence, the control unit is in particular suitable and designed to set deceleration torques of different levels for the deceleration and the release. Such a sequence (ripple) offers reliably perceptible haptic feedback even under difficult operating conditions and is implementable particularly well using the invention.

The sequence is in particular composed of a sequence of relative maxima having high deceleration torque and relative minima having low deceleration torque. In particular, an angle interval of a period of adjacent relative maxima is settable and is set. In particular, the profile of the deceleration torque over a period is set in dependence on a set operating mode. Such a sequence having particularly short intervals can also be referred to as a ripple/ticks. In particular, such a sequence made up of a defined combination of deceleration torques is formed as a function of the time and/or the angle. Preferably, the deceleration torques for the deceleration and/or the release are set as a function of the time and/or as a function of the angle and/or in dependence on a control command.

The deceleration torques of the sequence are in particular started and/or stopped and/or ended in dependence on angle and/or in dependence on time. A change of such dependencies within a sequence can preferably also be provided. For example, the start of the sequence takes place in dependence on angle or in dependence on time and the length of the sequence is then set in dependence on time or in dependence on angle.

Preferably, the control unit is suitable and designed to start the deceleration torques of the sequence in dependence on angle and maintain them in dependence on time. In particular, the control unit is suitable and designed to omit a setting of a deceleration torque provided in the sequence if an angle position (specific rotational angle of the operating element) provided for the start is overshot while maintaining a deceleration torque.

The control unit is particularly preferably suitable and designed to set the different deceleration torques of the sequence at a deliberate frequency and preferably to set them at such a frequency that the movement of the operating element is damped using a deliberate vibration. In particular, the frequency is at least 20 Hz and preferably at least 50 Hz.

The control unit is in particular suitable and designed to dynamically adapt the different deceleration torques of the sequence over the time and/or the angle and/or the movement speed (angular velocity) of the operating element and/or the number of settings of deceleration torques which has already taken place.

The control unit is in particular suitable and designed to set a sequence having deliberately changing deceleration torques. In particular, a sinusoidal or co-sinusoidal curve is provided for this purpose. In particular, the curve has a (slight) offset in the negative for this purpose. The offset is in particular less than 30% and in particular less than 20% and preferably less than 10%. In particular, at least two zero crossings per period are provided for the curve. In particular, the brake unit is controlled using a sine or cosine signal, in particular having a predetermined and in particular settable (slight) offset from the zero point.

In all embodiments, it is possible and advantageous that the operating element and/or the brake unit is at least partially enclosed by at least one display unit. The operating element and/or the brake unit can be enclosed by the display unit on one side or on two (opposing) sides or on three sides or on four sides and/or over the entire circumference. The operating element and/or the brake unit can be enclosed by the display unit in a manner at least partially spaced apart and/or touching. The display unit is in particular a display (which is in particular touch-sensitive) or comprises at least one such display. The operating element and/or the brake unit can be at least partially integrated in the display unit.

In particular, the display unit is suitable and designed to display a content in dependence on which actuating zone the operating element is actuated from and/or which actuating zone was previously activated. In particular, the display unit is suitable and designed to display a respective operating mode and particularly preferably a (present) respective function assignment of the actuating zones.

In particular, an axis of rotation of the brake unit is arranged recessed in relation to an outer surface of the display unit. In particular, the operating element protrudes with less than half of its diameter or circumference out of the outer surface of the display unit.

The operating device can be designed as a remote control. The remote control is used to carry out inputs into an input receiving unit that can be coupled to the remote control. The remote control can be designed as a TV remote control and/or hi-fi remote control and/or game console remote control (game controller) and/or as a remote control for other electronic devices, preferably entertainment electronic devices.

The remote control can preferably be designed to operate TV devices and/or other types of entertainment devices, for example, game consoles. For example, one actuating zone is assigned to setting the volume and the other actuating zone to a channel selection. These actuating zones are preferably located adjacent to one another. However, they can also be spaced apart by at least one further actuating zone. For example, at least one (middle) actuating zone can be provided for menu selection. A volume which is preferred or matches a specific film, for example, can be haptically communicated to the user as a help or proposal by a briefly stronger torque peak. For example, a torque peak for a preferred channel can be haptically output via the operating element when channel surfing is carried out and the preferred channel is reached. Channels on which, for example, advertisements are transmitted can thus be skipped during scrolling, channels on which preferred films are running can be selected or marked by haptic feedback (for example, brief barrier or high torque). In all embodiments, it is preferred that preferred menu points (favorites) can be haptically marked (for example, by torque peaks).

An embodiment having three actuating zones is also possible. For example, menus can then be selected using the third actuating zone. Such a remote control is particularly advantageously also usable in the selection of applications in a smart TV. Preferred channels or applications can be haptically marked, for example, using a raster and/or using stop points. Analogous functions are accordingly also implementable on a game controller.

The operating element can also be enclosed by a display in the embodiment as a remote control. The display can then display, for example, what can presently be adjusted. If the remote control is used, for example, to change the settings of a radio, the display accordingly displays images, e.g., a play symbol, a fast-forward and rewind symbol, a mute button, etc.

The operating device can be designed as a smart device (also referred to as a mobile terminal or mobile device), in particular a smart phone. In particular, the operating element can be suitable and designed to operate the smart phone itself and/or to operate devices that can be coupled to the smart phone.

It is possible in all embodiments of the invention that a pressing intensity on the operating element and in particular on a specific actuating zone is also detected and taken into consideration for the input. By way of example, in the case of only light pressing, an input begins or a function is selected and/or started. Stronger pressing can be provided, for example, for confirmation or execution of a command. In particular, the haptic feedback changes in dependence on the selected function. This has the advantage that the user can recognize what he has selected and what he sets.

It is possible in all embodiments of the invention that the operating device is permanently integrated in a device and, for example, notebook. For example, the operating device can then be provided by an operating element integrated in a touchpad.

In all embodiments of the invention, it is possible that the rotatability of the operating element is drivable by means of at least one drive unit. In particular, the operating element is thus actively rotatable around its axis of rotation. The drive unit in particular comprises at least one motor, for example, an electric motor, pneumatic drive, ultrasonic motor, piezo-actuator, linear motor. The drive unit is preferably provided in addition to the brake unit. This has the advantage that the operating element is both actively movable and also can be braked in a power saving manner using the (magnetorheological) brake unit. It is also possible that the brake unit is replaced by the drive unit (in particular its motors).

The drive unit is activatable in particular in dependence on at least one control command. In particular, the drive unit can convert the control command into at least one haptic signal (force feedback) perceptible at the operating element.

Further advantages and features of the present invention result from the description of the exemplary embodiments, which are explained hereinafter with reference to the appended figures.

DETAILED DESCRIPTION OF THE INVENTION

Figure 1A:
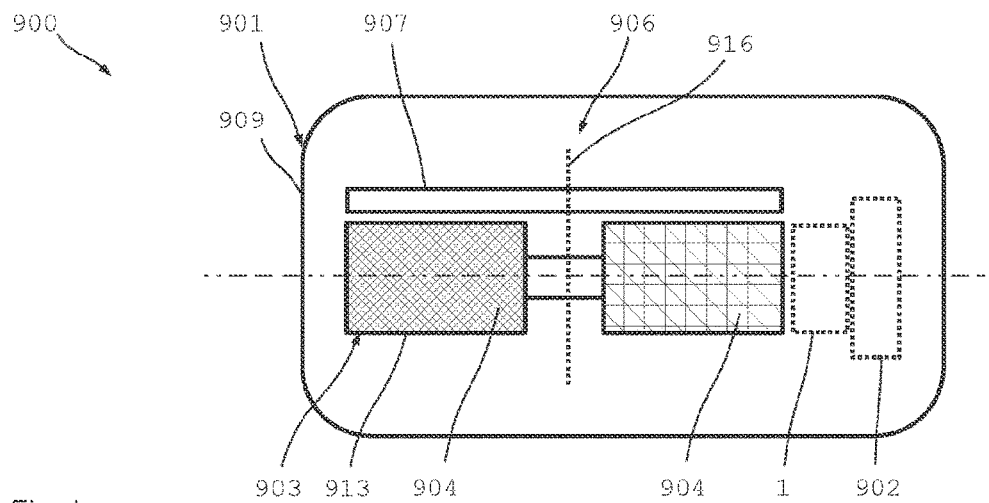
FIGS. 1a-1b show solely schematic illustrations of operating devices according to the invention in a top view.
Figure 1B:
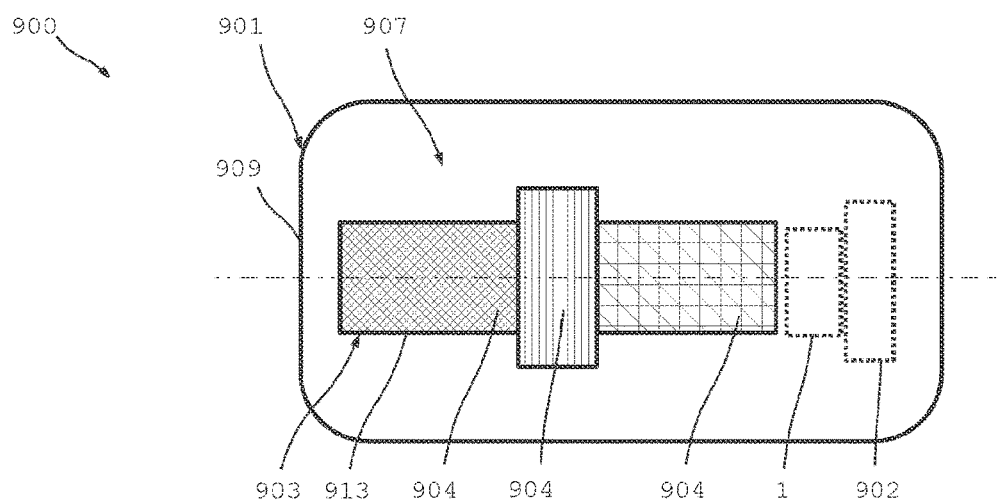
Figure 1C:
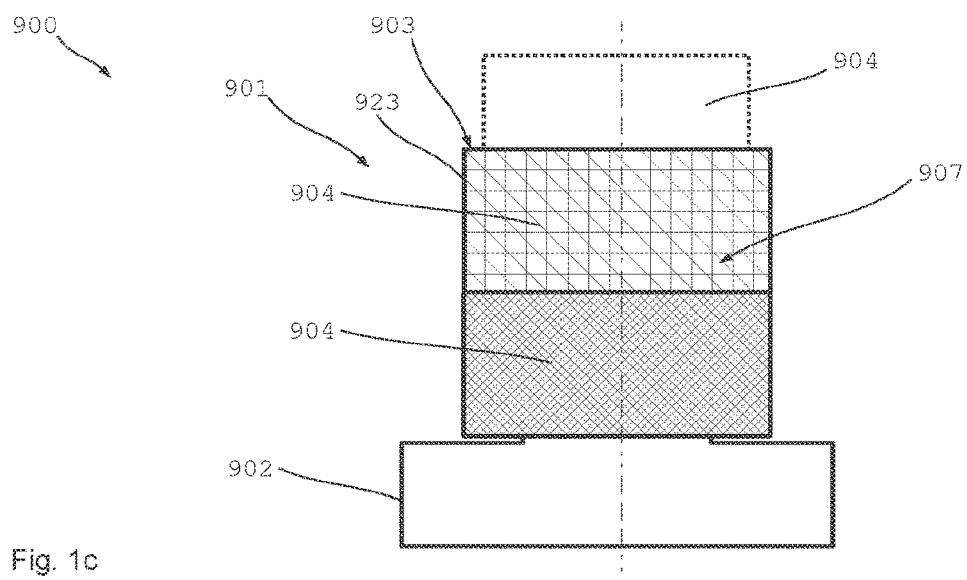
FIG. 1c shows a solely schematic illustration of an operating device in a side view.

Operating devices 900 according to the invention are shown in FIGS. 1a to 1c. The operating devices 900 each comprise an operating unit 901 and a magnetorheological brake unit 1 here. The brake units 1 are arranged in the interior of the operating units 901 so they are not visible here. The operating devices 900 are operated according to the method according to the invention.

The brake units 1 are used to deliberately set a torque or damping for a rotational movement of an operating element 903 of the respective operating unit 901. The operating element 903 is rotatably mounted on a receptacle part 902, which is arranged in the interior of a housing 909 so it is not visible here.

In FIG. 1*a*, the operating device 900 is equipped with an operating element 903, designed as a finger roller 913, having two actuating zones 904. The finger roller 913 is, for example, actuated using a thumb or the index finger. The receptacle part 902 is arranged in the interior of a housing so it is not visible here. The housing 909 can be provided, for example, by the input receiver to be operated and can be a vehicle, for example.

The actuating zones 904 differ here, for example, in their surface structure and/or in their illumination. A haptic or visual differentiation of the actuating zones 904 is thus possible. The actuating zones 904 are arranged axially adjacent to one another and spaced apart on a common axis of rotation (sketched by dot-dash lines) here. The actuating zones 904 are connected to one another in a rotationally-fixed manner, so that they can only be rotated jointly.

The torque for the rotational movement of the operating element 903 is deliberately settable here in dependence on the actuating zone 904 from which the operating element 903 is rotated. It is detected by a monitoring unit 907, for example, having a proximity sensor or contact sensor, which of the actuating zones 904 is used for rotation.

The operating element 903 shown here can be designed as a rocker 906. For this purpose, the operating element 903 is accommodated using a rocker bearing 916 (sketched by dashed lines) on the receptacle part 902. The operating element 903 can thus, in addition to the rotational movement, also be tilted to both sides of the rocker bearing 916 in order to perform an input. Depending on which side the operating element 903 is pressed toward, a defined input takes place. The rocker bearing 916 is arranged here between the actuating zones 904. The operating element 903 can also be designed as a rocker 906 in the other embodiments presented here. Alternatively, it can also be provided that the operating element 903 can be pressed without rocker bearing 913.

The operating device 900 shown in FIG. 1*b* differs from the above-described operating device 900 by way of an operating element 903, which has three actuating zones 904 here. The middle actuating zone 904 is equipped here with a significantly enlarged diameter. The actuating zones 904 moreover have different surface structures and/or can be illuminated differently here.

Moreover, a gesture recognition zone 917 of the monitoring unit 907 is sketched here. The monitoring unit 907 thus recognizes where the finger and/or the hand is located and takes this into consideration for the activation of the actuating zone 904. Additionally or alternatively, an input can also be carried out by a corresponding recognizable gesture. The input then takes place by way of the gesture itself. For example, pushing on the operating element 903 ("push") or the rocker function can be replaced by a gesture and, for example, waving the hand in the air. Moving the fingers from, for example, right to left over the gesture fields can delete a command or mean "back". Moving the fingers or an input object over the touch surfaces from left to right confirms the command. Such an embodiment can also advantageously be combined with the other embodiments presented here.

FIG. 1*c* shows an embodiment of the operating device 900 in which the operating unit 901 has an operating element 903 designed as a rotating knob 923. The rotating knob 923 is grasped between thumb and index finger, for example, for actuation. The operating element 903 has two actuating zones 904 here. A further actuating zone 904 is indicated here by dashed lines. The brake unit 1 is arranged in the interior so it is not visible here.

Figure 1D:
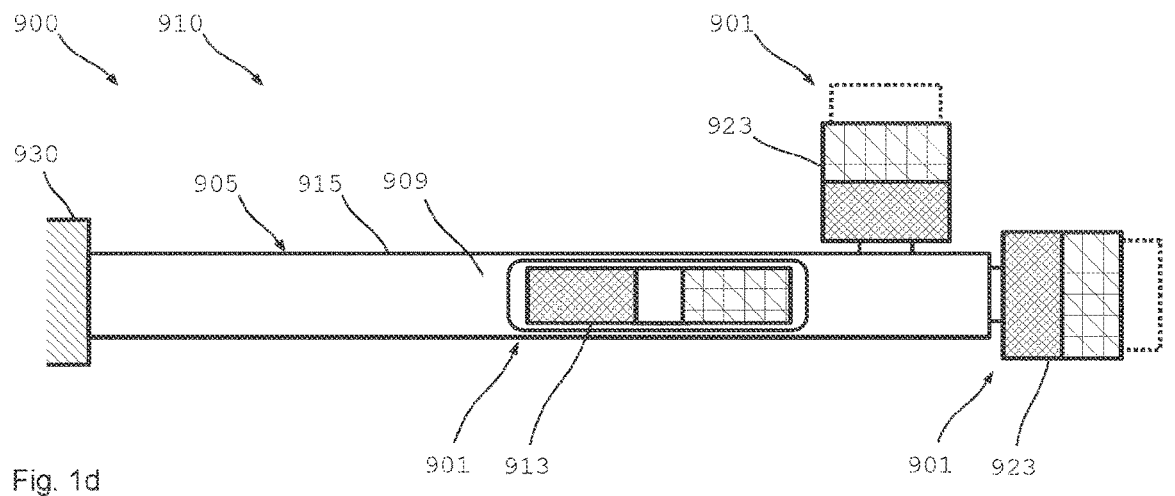
FIG. 1d shows a very schematic operating device in a side view.

FIG. 1*d* shows an operating device 900 which is equipped here with a pivotable operating lever 905. The operating lever 905 can be actuated by pivoting (for example, pulling and/or pushing) and is used at the same time for fastening the operating unit 901.

Three operating units 901 are fastened solely by way of example here on the operating lever 905. In this case, one operating unit 901 is equipped with an operating roller 913 and two operating units 901 are each equipped with a rotating knob 923 here. However, fewer or more operating units 901 or other combinations of operating units 901 can also be provided on the operating lever 905.

The operating units 901 are fastened here by means of their receptacle parts 902 on the operating lever 905. The operating elements 903 can thus be moved independently of the operating lever 905, while the operating units 901 are also moved upon pivoting of the operating lever 905.

The operating lever 905 shown here is designed solely by way of example as a control stalk 915 for a motor vehicle. The control stalk 915 is fastened on a vehicle support structure 930 and, for example, on a steering column or another cockpit part. The typical operating options of a control stalk 915 can thus be carried out using the operating unit 901 and even expanded.

The control stalk 915 can also be fastened fixedly or immovably on the vehicle support structure 930. The operating processes which are otherwise carried out by pivoting the control stalk 915 are then executed using the individual actuating zones 904. The actuating zones 904 can also be dynamically assigned functions here, so that a large variety of operating options can be executed and haptically assisted using a smaller number of actuating zones 904.

The operating device 900 of FIG. 1*d* provides a vehicle component 910 according to the invention here. The other operating devices 900 presented here can also be vehicle components 910 and can be used to operate functions of a vehicle. The operating units 910 are fastened or integrated here, for example, on a steering wheel, a selection lever for transmission or (electric) drive, in a cockpit or other support structures of the vehicle.

The operating unit 901 shown here can also be integrated in a steering wheel. The operating processes or inputs which are otherwise carried out using a movement of the control stalk 915 can thus take place directly from the steering wheel, so that control stalk 915 can be dispensed with entirely.

Figure 1E:
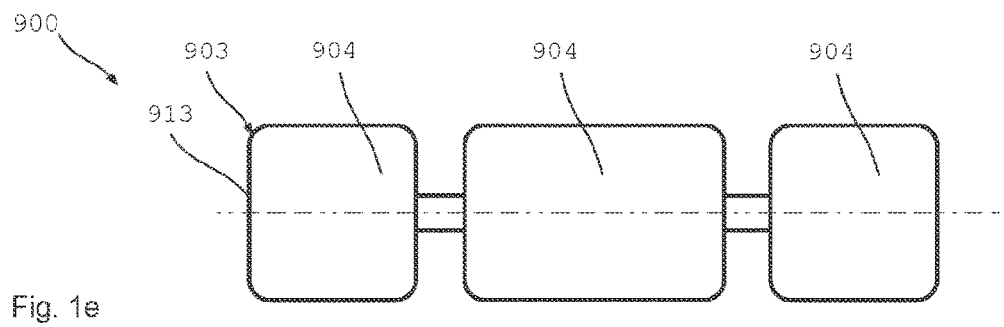
FIGS. 1e-1g show solely schematic illustrations of operating elements of operating devices according to the invention.

FIG. 1*e* shows an operating element 903 having three (cylindrical) actuating zones 904 spaced apart from one another. The actuating zones 904 have the same diameter here. The axis of rotation is shown by a dot-dash line.

Figure 1F:
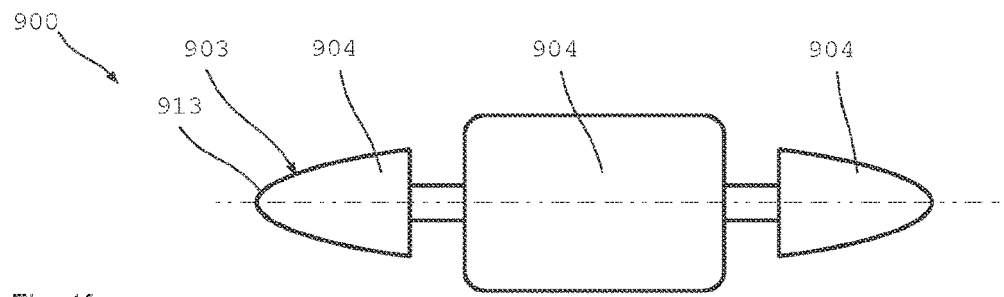

FIG. 1*f* shows an operating element 903 having three actuating zones 904 spaced apart from one another. The middle actuating zone 904 is formed cylindrical here. The lateral actuating zones 904 are formed conical here.

Figure 1G:
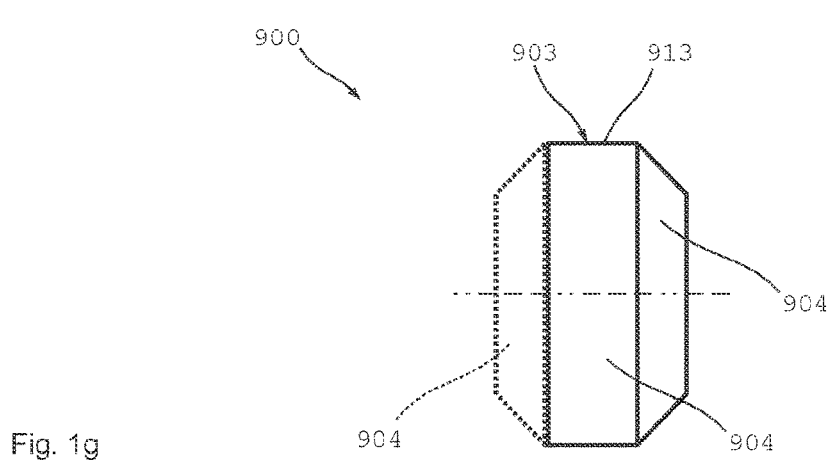

FIG. 1*g* shows an operating element 903 which is beveled on one axial side. The operating element 903 can also be beveled on both axial sides (shown by dashed lines). A cylindrical actuating zone 904 thus results, which is adjoined on one or both sides by conical actuating zones

904. For example, as soon as the beveled actuating zone 904 is touched, scrolling without raster can take place. In contrast, if the cylindrical or middle actuating zone 904 is touched, scrolling with raster can take place.

Many advantages result upon the operation of the operating devices 900 shown here. Depending on the open application, for example, important functions are placed on the actuating zones 904. In a drawing program, for example, the color can be selected using the left actuating zone 904 and the tool can be selected using the right actuating zone 904. The middle actuating zone 904 is used, for example, for zooming. Depending on the number of colors/tools, the operating element 903 then receives a different ripple or a different raster.

If an IDE (integrated development environment) is now opened, for example, the left section is used to select an element from the toolbox.

For example, the task bar can be shown upon touching an actuating zone 904. The selection of the switch surfaces selected by the user (text processing, browser, calendar, etc.) is facilitated by means of haptic feedback. When working with multiple programs or windows or also browser tabs, the actuating zone 904 of the operating element 903 can be used for navigation. Windows or tabs which are preferred or used more often or reasonably suggest themselves are haptically reproduced differently (different haptic feedback).

In advantageous embodiments, the assignment of the actuating zones 904 can be programmed by the user. This function is then maintained. For example, the volume can always be adjusted using the left actuating zone 904. The higher the volume becomes, the rotation can become more and more difficult in this case. The embodiment of the operating element 903 as a rocker can replace, for example, left and right clicking.

The brake unit 1 for damping the operating element 903 is presented in more detail hereinafter. The operating elements 903 for this purpose described hereinafter each have two or more actuating zones 904, which are not shown in greater detail for better clarity.

Figure 2:
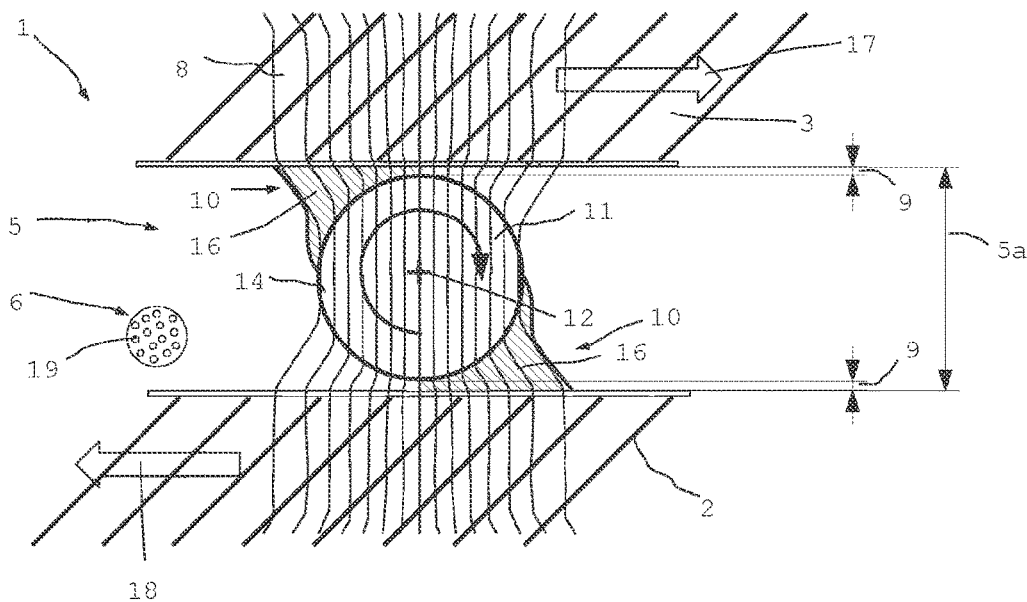
FIG. 2 shows a very schematic cross section through a roller body of a magnetorheological brake unit.

FIG. 2 shows a very schematic cross-sectional view of a magnetorheological brake unit 1 of an operating device 900 according to the invention. The brake unit 1 comprises two brake components 2, 3 here. One of the brake components 2, 3 provides the operating element 903 or carries it here. The operation thus takes place here at least by direct or also indirect rotation of one of the brake components 2, 3. The respective other brake component 2, 3 then in particular provides the receptacle part 902.

The magnetorheological brake unit 1 is used to influence the force transmission between the brake components 2 and 3. A roller body or rotating body 11 is provided here between the two brake components 2 and 3 in FIG. 2. The roller body 11 is formed here as a ball 14. However, forming roller bodies as cylinders or ellipsoids, rolls, or other rotatable rotating bodies is also possible. Rotating bodies which are not rotationally symmetrical in the actual meaning, for example, a gear wheel or rotating body 11 having a specific surface structure can also be used as roller bodies. The roller bodies 11 are not used for mounting in relation to one another, but rather for transmitting torque.

A channel 5 is provided between the brake components 2 and 3, which is filled here with a medium 6. The medium is a magnetorheological fluid here, which comprises, for example, as a carrier liquid an oil in which ferromagnetic particles 19 are present. Glycol, grease, water, and viscous materials can also be used as the carrier medium, without being restricted thereto. The carrier medium can also be gaseous or the carrier medium can be omitted (vacuum). In this case, only particles influenceable by the magnetic field are filled in the channel.

The ferromagnetic particles 19 are preferably carbonyl iron powder, wherein the size distribution of the particles is dependent on the specific usage case. Specifically, a distribution of the particle size between 1 and 10 µm is preferred, wherein, however, larger particles of 20, 30, 40, and 50 µm are also possible. Depending on the application, the particle size can also become significantly larger and even advance into the millimeter range (particle spheres). Particles can also have a special coating/casing (titanium coating, ceramic, carbon casing, etc.), so that they better withstand the high pressure loads occurring depending on the application. The magnetorheological particles can be produced for this application not only from carbonyl iron powder (pure iron), but also, for example, from special iron (harder steel).

The roller body 11 is preferably set into rotation around its axis of rotation 12 by the relative movement 17 of the two brake components 2 and 3 and practically runs on the surface of the brake component 3. At the same time, the roller body runs on the surface of the other brake component 2, so that a relative velocity 18 is present there.

To be precise, the roller body 11 has no direct contact with the surface of the brake components 2 and/or 3 and therefore does not roll directly thereon. The free distance 9 of the roller body 11 from one of the surfaces of the brake components 2 or 3 is, for example, 60 µm. In a specific embodiment having particle sizes between 1 µm and 10 µm, the free distance is in particular between 10 µm and 300 µm and particularly preferably between 40 µm and 120 µm.

The free distance 9 is in particular at least 10 times the diameter of a typical mean particle diameter. The free distance 9 is preferably at least 10 times a largest typical particle. Due to the lack of direct contact, a very low basic friction/force/torque results during the relative movement of the brake components 2 and 3 in relation to one another.

If a magnetic field is applied to the magnetorheological brake unit 1, the field lines form in dependence on the distance between the roller bodies 11 and the brake components 2, 3. The roller body 11 consists of a ferromagnetic material and, for example, of ST 37 here (S235). The steel type ST 37 has a magnetic permeability µr of approximately 2000. The field lines (magnetic circuit) pass through the roller body and concentrate in the roller body. A high magnetic fluid density prevails in the channel 5 at the radial entry and exit surfaces of the field lines on the roller body here. The inhomogeneous and strong field there results in a local and strong networking of the magnetically polarizable particles 19 (magnetic interlinking). The effect is strongly increased by the rotational movement of the roller body 11 in the direction of the wedge forming (accumulation) in the magnetorheological fluid and the possible braking or coupling torque is extremely enlarged, far beyond the amount which can normally be generated in the magnetorheological fluid. Roller body 11 and brake components 2, 3 preferably at least partially consist of ferromagnetic material, because of which the magnetic flux density becomes higher the smaller the distance is between rotating body 11 and brake components 2, 3. An essentially wedge-shaped region 16 thus forms in the medium, in which the gradient of the magnetic field increases strongly toward the acute angle at the contact point or the region of the least distance.

In spite of the distance between roller body 11 and brake components 2, 3, the roller body 11 can be set into a rotational movement by the relative velocity of the surfaces in relation to one another. The rotational movement is possible without and also with an active magnetic field 8.

When the magnetorheological brake unit 1 is subjected to a magnetic field 8 of an electrical coil 26 (not shown here in FIG. 2), the individual particles 19 of the magnetorheological fluid 6 interlink along the field lines of the magnetic field 8. It is to be noted that the vectors shown in FIG. 2 only roughly schematically represent the region of the field lines relevant for influencing the MRF. The field lines enter the channel 5 essentially normally on the surfaces of the ferromagnetic components and above all do not have to extend linearly in the acute-angled region 10.

At the same time, some material is also set into rotation by the magnetorheological fluid on the circumference of the roller body 11, so that an acute-angled region 10 forms between the brake component 3 and the roller body 11. On the other side, an identical acute-angled region 10 results between the roller body 11 and the brake component 2. The acute-angled regions 10 can have a wedge shape 16, for example, with roller bodies 11 which are formed cylindrical. Because of the wedge shape 16, the further rotation of the roller body 11 is prevented, so that the effect of the magnetic field on the magnetorheological fluid is amplified, since a stronger cohesion of the medium 6 therein due to the active magnetic field inside the acute-angled region 10. The effect of the magnetorheological fluid in the accumulated clusters is thus amplified (the interlinking in the fluid and thus the cohesion or the viscosity), which obstructs the further rotation or movement of the rotating body 11.

Due to the wedge shape 16 (particle accumulation), significantly greater forces or torques can be transmitted than would be possible using a comparable structure, which only uses the shear movement without wedge effect.

The forces transmittable directly by the applied magnetic field only represent a small part of the forces transmittable by the device. The wedge formation and thus the mechanical force amplification may be controlled by the magnetic field. The mechanical amplification of the magnetorheological effect can extend far enough that a force transmission is also possible after switching off an applied magnetic field when the particles have been wedged.

It has been shown that a significantly greater effect of a magnetic field 8 of a specific strength is achieved by the wedge effect of the acute-angled regions 10. The effect can be amplified multiple times. In a specific case, an influence of the relative velocity of two brake components 2 and 3 in relation to one another was observed which was approximately 10 times as strong as in the prior art in MRF couplings according to the shear principle, in which a magnetorheological fluid is arranged between two surfaces moving in relation to one another and is subjected to the shear forces of the surfaces moving in relation to one another. The possible amplification here by the wedge effect is dependent on different factors. It can possibly also be amplified by a greater surface roughness of the roller bodies 11. It is also possible that projections protruding outward are provided on the outer surface of the roller bodies 11, which can result in an even stronger wedge formation.

The wedge action or the wedge effect is distributed flatly on the roller body 11 and the components 2 or 3.

Figure 3:
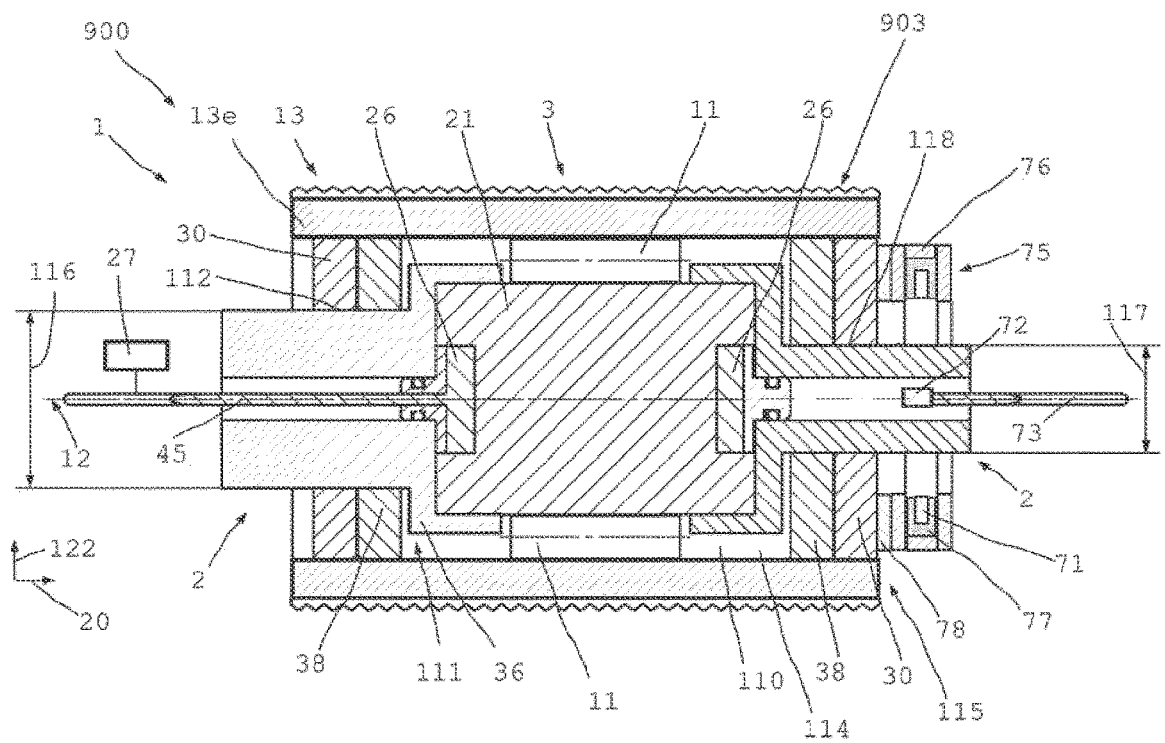
FIG. 3 shows a schematic cross section through a brake unit.

FIG. 3 shows a section through an operating device 900 in the region of the magnetorheological brake unit 1 of the operating element 903. The brake unit 1 has two brake components 2 and 3. The first brake component 2 and the second brake component 3 extend essentially in an axial direction 20. The first brake component 2 is arranged here in the interior of the second brake component 3 and is held in a formfitting and/or friction-locked manner by a holder 4. The holder 4 is normally fastened on the support structure 902 of the operating device 900.

The second brake component 3 is accommodated on the first brake component 2 so it is continuously rotatable thereon in relation thereto. The second brake component 3 forms the rotatable operating element 903 here or is connected thereto in a rotationally fixed manner.

The second brake component 3 is formed oblong and has the rotating part 13 and a magnetically conductive sleeve part 13e therein.

The second brake component 3 is rotatably accommodated on the second brake component 2 at the first bearing point 112 and at the second bearing point 118 and can also be mounted so it is axially displaceable. Forces in a global radial direction 122 can be supported by the bearings 30 at the bearing points 112, 118, while the first brake component 2 is relatively displaceable axially in relation to the second brake component 3. The diameter 116 of the first bearing point 112 is approximately twice as large here as the diameter 117 of the second bearing point 118.

The second brake component 3 is led out at both ends. A closed chamber 110, which is filled with a magnetorheological fluid (MRF), is formed between the brake components 2 and 3. A cylindrical running surface is formed on the holder 4 as the first bearing point 112 in the region of the first end 111 of the chamber 110. A hardened surface or a surface of corresponding quality is provided there. A bearing 30 for rotatable mounting of the second brake component 3 is attached to this cylindrical running surface 37. A seal 38 is provided adjacent to the bearing 30 farther inward in the axial direction 20. The seal 38 reliably seals off the interior.

A further bearing option is the mounting on the external housing of the MRF brake. The shaft at which the torque has to be dissipated is thus not loaded. No bending of the parts in the interior of the brake occurs (displacement of the axis in relation to the sleeves). The friction radius is thus enlarged, but installation space is saved in the axial length, since axle stubs do not have to protrude out of the sleeve for mounting.

The first brake component 2 has a main body 33. The windings of an electrical coil 26 are wound around the core 21. The individual turns of the electrical coil 26 protrude outward beyond the cylindrical main body 33 (cf. FIG. 5).

A gap 5, which is essentially embodied here as a hollow cylindrical gap, exists radially between the outer wall of the first brake component 2 and the inner wall of the sleeve part 13. Multiple transmission components 11, which are formed as roller bodies here, are arranged in the gap. The roller bodies 11 are formed here as cylindrical roller bodies and have an external diameter which is somewhat less than the gap width of the gap 5. The gap 5 is furthermore filled here with a magnetorheological medium.

In one region of the gap, for example, an O-ring filled with air or another gas or the like can be arranged, which provides a volume compensation in the event of temperature variations. In addition, a reservoir is thus formed there if magnetorheological fluid or medium escapes outward from the interior in the course of operation. The design is used here to provide an automatic temperature compensation and a reservoir for MRF by way of the diameters 116, 117 of different sizes.

The (usable) gap length of the gap 5 is greater here than the length of the roller bodies 11. The electrical coil is also formed longer here in the axial direction 20 than the length of the roller bodies 11.

The core 21 can be seen in the interior of the electrical coil 26. The holder 4 has a radially enlarged receptacle 36 (diameter 36a, cf. FIG. 4) for the rotationally-fixed accommodation of the first brake component 2. A cable feedthrough extends downward through the holder 4 through the holder 4. Cables 45 for connecting the electrical coil 26 and possibly sensor lines are led out there. A control unit 27 can be provided or assigned in the base of the holder 4 or at other suitable points to perform a control as needed.

A closed chamber 110 is formed between the first end 111 and the second end 115. The closed chamber 110 comprises the volume 114, which is filled essentially completely with the magnetorheological medium 6.

A change of the volume of the magnetorheological medium 6 results here in a relative axial displacement of the first brake component 2 in relation to the second brake component 3 due to the different diameters 116, 117 of the two bearing points 112, 118.

For the case in which the first brake component 2 is fixed, the second brake component 3 is displaced to the right in case of a volume increase in the orientation of FIG. 3. A small part of the first brake component 2 having the diameter 116 at the first bearing point 112 exits from the closed chamber 110, while a part of the first brake component 2 at the second end 115 having the significantly smaller diameter enters the closed chamber 110. In the final effect, the volume 114 of the closed chamber 110 is thus increased. A volume change of the magnetorheological medium 6 caused by a temperature increase can thus be compensated for in particular. A function of the magnetic field generating unit 113 is not influenced in this way. In case of a volume decrease, which can occur due to temperature or also due to a leak, the second brake component 3 is displaced to the left here.

During the displacement, ambient pressure prevails practically always inside the magnetorheological brake component 1. An additional load of the seals 38 is thus prevented above all. With a compensation unit via a gas bubble, the interior is always placed under overpressure, in contrast, due to which a higher leakage and a higher friction result due to the better seal required or due to the pressure on the sealing lip, respectively.

A compensation channel 120 can be provided, which connects the regions close to the bearing points 112, 118 to one another. In the event of a displacement of the magnetorheological medium 6, the throttle effect of the gap is thus reduced, if it is supposed to be very small.

In addition, the magnetorheological brake unit 1 has a sensor unit 70 at least for detecting an angular position of the two brake components 2, 3 in relation to one another. The detection takes place using a magnetic ring unit 71 and by means of a magnetic field sensor 72. The sensor unit 70 is connected here via a decoupling unit 78 to the second brake component 3. The decoupling unit 78 magnetically decouples the sensor unit. The sensor unit 70 furthermore comprises a shielding unit 75 here, which comprises multiple shielding bodies 76 here and encloses the magnetic ring unit 71 on three sides. An isolating unit 77 is provided between the magnetic ring unit and the shielding unit 75. The isolating unit 77 additionally shields the magnetic ring unit 71. The volume spanned by the magnetic ring unit 71 is thus substantially shielded from magnetic influences of the electrical coil 26 or other magnetic fields.

Figure 4:
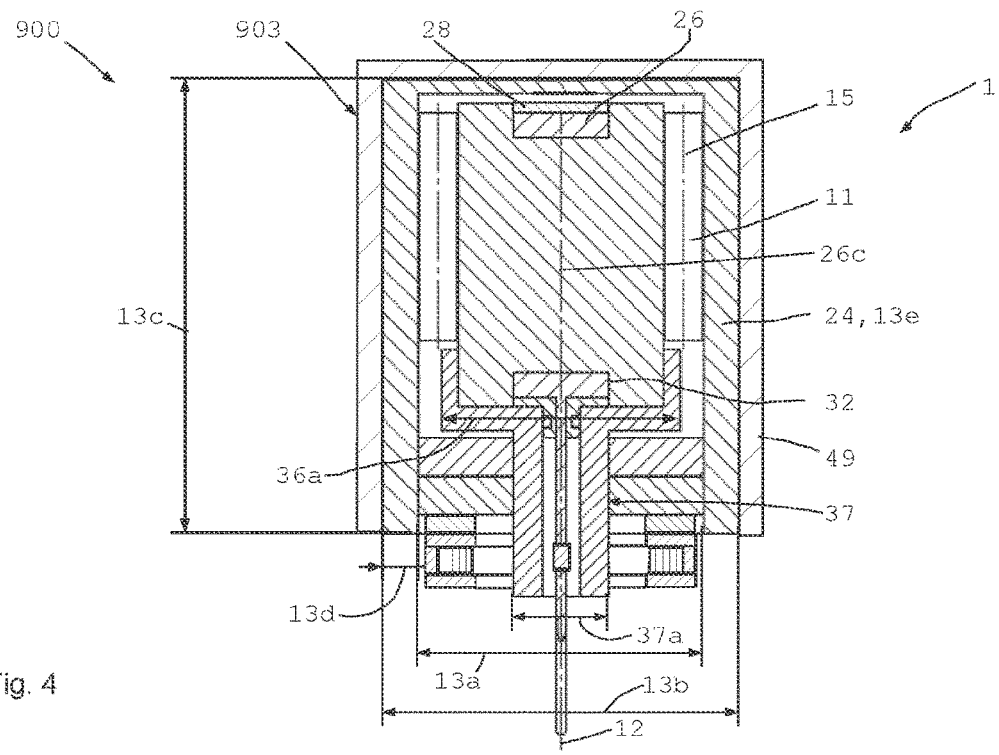
FIG. 4 shows a cross section of a further brake unit.

FIG. 4 shows another operating device 900 in section having a similar magnetorheological brake unit 1. The operating element 903 is either rotatably accommodated on one side on the support structure 902 or an axle stub is also formed at the second end to rotatably mount the operating element 903 on two sides.

Transverse grooves 32 are recognizable, in which the electrical coil 26 is wound at the axial ends of the core 21. Potting compound 28 is provided in each case in the axial direction for the termination at both ends. A separate seal via, for example, the O-ring shown or the like is provided in the region of the cable feedthrough 35.

It is also possible that individual ones of the roller bodies arranged distributed over a part of the circumference are formed as magnetically nonconductive transmission components. All roller bodies are preferably made of magnetically conductive material, for example steel.

A length or height 13c of the rotating part 13 and the sleeve part 13e or the second brake component 3 in the axial direction 20 is preferably between 3 mm and 90 mm and in particular between 5 mm and 30 mm. A coating 49 can be applied externally to the second brake component 3, so that the external appearance of the operating element 903 is essentially determined by the surface of the coating 49. Different segments can be distinguished by different surfaces.

The material of the sleeve part 13e or the rotating part 13 as a whole is magnetically conductive and is used to close the magnetic circuit. A wall thickness 13d of the sleeve part 13e is preferably at least half as large as a diameter of the roller bodies 11.

The diameter 36a of the receptacle 36 is preferably significantly greater than the diameter 37a of the cylindrical running surface 37. The friction at the seal 38 is thus reduced. In addition, standardized bearings can be used.

It is also possible to embody the core 21 and also the holder 4 in two parts. The partition preferably extends along the center line shown in FIG. 11, due to which a left and a right (core) half result. The two core halves can be spaced apart from one another by a magnetically nonconductive element (for example a seal). The potting compound volume 28 is preferably then a part of the core half (halves), due to which a semicircular element results having a circumferential groove on the partition surface for the electric coil. The receptacle 36 is furthermore preferably also separated into two halves. One receptacle half can also form a part with one core half (can be integrally embodied) or one core half can be integrally embodied with a complete receptacle unit 36.

The operating element 903 is mounted on one side here with the magnetorheological brake unit 1. The second brake component 3 is only accommodated here at the first end of the closed chamber 110 at an end section 121 of the first brake component 2, i.e., the second brake component 3 is only mounted by the bearing 30 at the first bearing point 112. In the event of a change of the volume inside the closed chamber, the second brake component 3 can move back and forth slightly. It has occurred here again that the first brake component 2 is fixed. In this case, a part of the diameter 116 of the first brake component 2 moves out or in at the first bearing point 112. The volume 114 of the closed chamber 110 changes. The system inside the given movement latitude is advantageously practically always at ambient pressure. An additional load of the seal 38 is prevented.

FIGS. 5a to 5d show various schematic cross sections of the magnetorheological brake unit 1, which are advantageously usable in the operating device 900.

The inner brake component 2 is formed fixed and is enclosed by the continuously rotatable brake component 3. The second brake component 3 has a rotating part 13, which is rotatable around the first brake component and is formed hollow and internally cylindrical. The circumferential gap 5 between the first and the second brake component 2, 3 is clearly recognizable. The gap 5 is filled here at least partially and in particular completely with a magnetorheological medium 6.

The first brake component 2 has the core 21 extending in the axial direction 20 made of a magnetically conductive material and an electrical coil 26, which is wound in the axial direction 20 around the core 21 and spans a coil plane 26c. The magnetic field 8 of the electrical coil 26 extends transversely to the axial direction 20 through the first brake component 2 or the core 21.

It is clearly recognizable that a maximum external diameter 26a of the electrical coil 26 in a radial direction 26d within the coil plane 26c is greater than a minimum external diameter 21b of the core 21 in a radial direction 25 transversely and, for example, perpendicularly to the coil plane 26c.

The roller bodies 11 are each only arranged in angle segments 61, 62 and cannot rotate completely around the core 21, since the electrical coil 26 protrudes into the gap 5 or channel and thus prevents a complete revolution.

Less space is thus available for the roller bodies 11. However, this results in an even higher concentration of the magnetic field 8. Three magnetic field lines are shown by way of example in FIG. 5a.

Figure 5A:
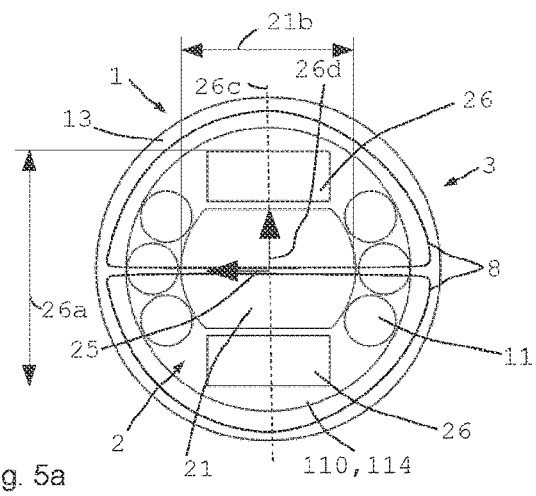
FIGS. 5a-5d show schematic cross sections of the brake units according to FIG. 10 or 11.
Figure 5B:
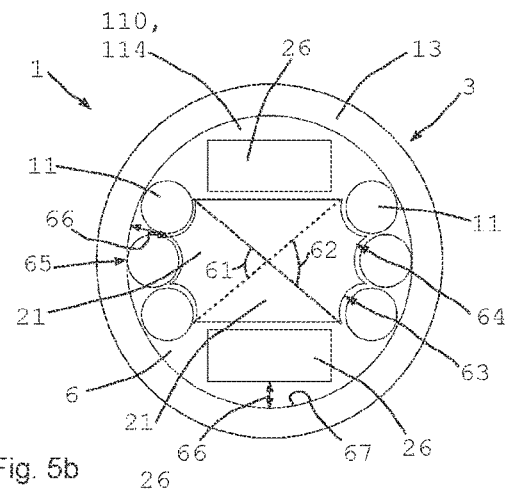

In FIG. 5b, the roller bodies 11 are not accommodated on a cylindrical outer surface of the core 21, but rather on receptacles 63 specially adapted to the contour of the roller bodies 11, on which the roller bodies 11 are preferably accommodated and guided with some play. The transition of the magnetic field 8 into the roller bodies 11 is advantageous since more transmission area is available between the core 21 or the outer surface 64 at the receptacles 63 and the roller bodies 11.

The electrical coil is arranged outside the angle segments 61 and 62. No roller bodies 11 are located outside the angle segments 61 and 62.

Figure 5C:
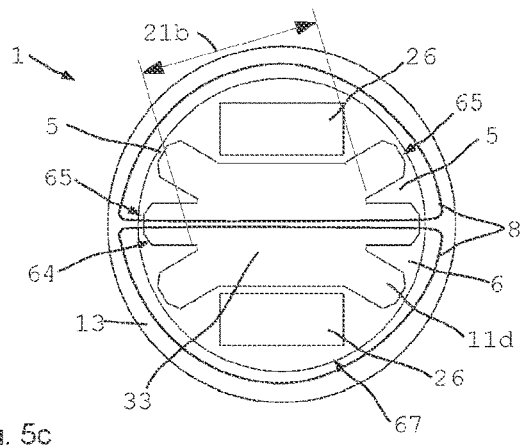
Figure 5D:
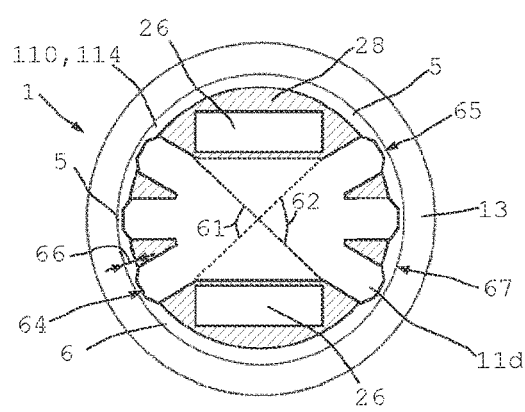

FIGS. 5c and 5d show refinements in which roller bodies 11 are omitted completely. The cores 21 have outwardly protruding transmission components 11, which extend radially outward from the main body 33 (magnetic field concentrators). In FIG. 5c, the chamber 110 between the core 21 and the rotating part 13 is completely filled with MRF.

The maximum external diameter 26a of the coil 26 is greater than the minimum core diameter 21b. The radial extension of the gap 5 varies over the circumference. There is only a small gap dimension 65 at the outer ends of the transmission components 11, while a radial distance 66 between the brake component 2 and the brake component 3 is significantly greater at other points.

FIG. 5d shows a variant of FIG. 5c in which the chamber is filled over a cylindrical section with potting compound 28 to reduce the MRF volume. The required volume of MRF thus decreases. The radial distance 66 is significantly reduced in size, but remains significantly greater (at least by a factor of 2 or 3 or 5 or 10) than the radial gap dimension 65. It is thus ensured that the described wedge effect (material accumulation) occurs. The MRF particles interlink and form a type of wedge which results in a significant braking torque. In FIGS. 5c and 5d, the transmission components 11 form a type of radial arms 11d.

FIGS. 6a to 6d show a further embodiment of an operating device 900, which again has a magnetorheological brake unit 1 and comprises brake components 2 and 3 here. A "recumbent or axial coil" is again used, in which the electrical coil is wound in the axial direction 20 around the core 21 and again has a maximum radial coil diameter 26a, which is greater than a minimum core diameter 21b of the core 21. The roller bodies or transmission elements are also not arranged over the entire circumference here.

The second brake component 3 is accommodated at the first end of the closed chamber 110 at the bearing point 112. In addition, the second brake component 3 is accommodated at the second bearing point 118 at the first brake component 2. The mounting is implemented here by means of an axle stub 119 having the diameter 117 at the second bearing point 118. The sealing ring 46 prevents the magnetorheological medium from flowing into the region behind the axle stub 119.

The diameter 117 at the second bearing point 118 is embodied significantly smaller here than the diameter 116 at the first bearing point 112. A volume change is thus also enabled here in the event of an axial displacement. Temperature-related volume changes and volume changes caused by leaks can be compensated for. For this purpose, a relative axial displacement of the first brake component 2 in relation to the second brake component 3 takes place.

In addition, a sensor unit 70 is also provided here for detecting an angular position of the rotor/operating element 903. The magnetic field sensor 72 is integrated in the fixed receptacle 4 or the first brake component 2. At the receptacle 36, the cable 45 of the magnetic field sensor 72, i.e., the sensor line 73, is led outward through the cable feedthrough 35.

Figure 6A:
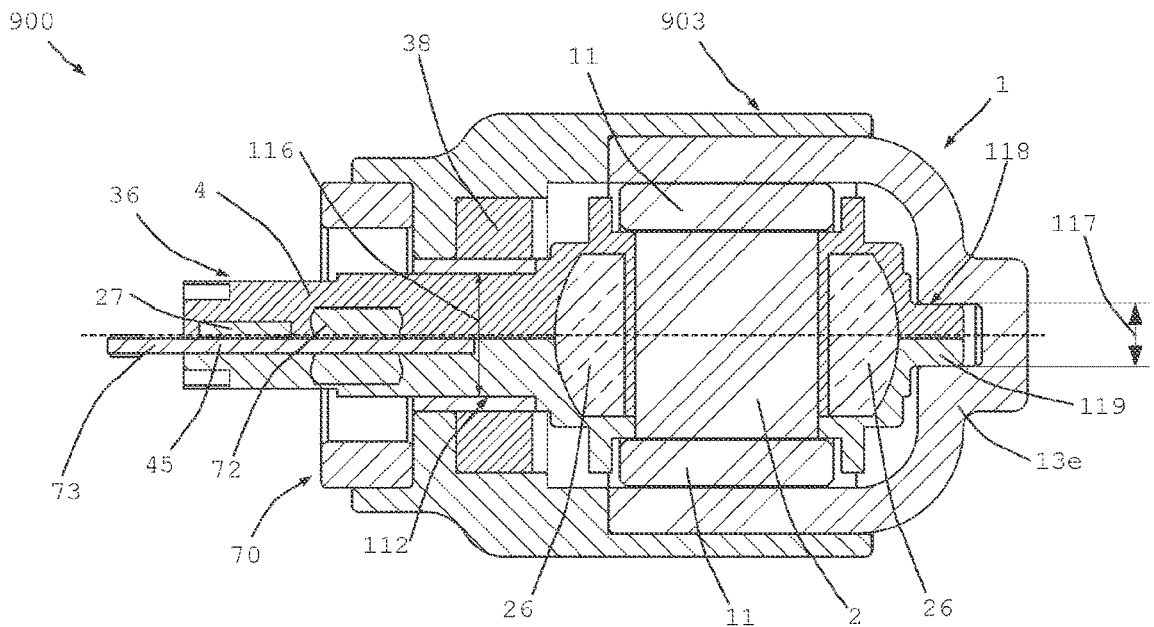
FIGS. 6a-6e show another brake unit.
Figure 6B:
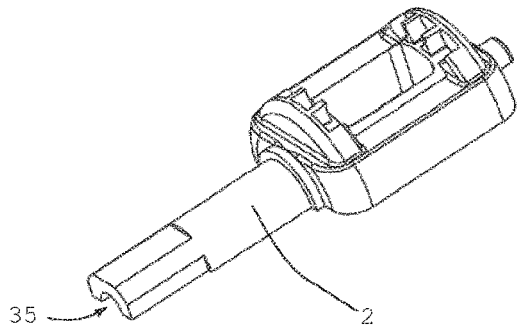
Figure 6C:
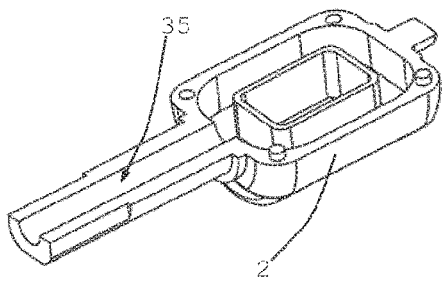

The first axle part or the holder of the brake component 2 can preferably be embodied in two parts, as shown in FIGS. 6b and 6c. Above all, the mounting of the electrical lines and in particular the sensor line 73 inside the first brake component 2 is thus simplified. The cables can be laid through the open cable feedthrough 35.

Figure 6D:
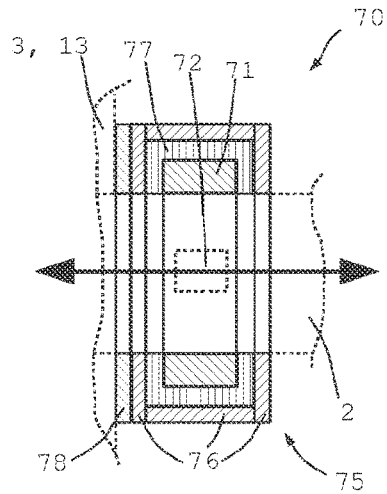

The sensor unit 70 is illustrated once again in detail in FIG. 6d. The first brake component 2 and the second brake component 3, which is embodied here as a rotating part, are only indicated (dashed lines). The sensor unit 70 supports itself via the decoupling unit 78 on the rotatable second brake component 3 in a magnetically decoupled manner. The shielding unit 75 consists here of three shielding bodies 76, which reduce the scattering of the magnetic field 8 of the electrical coil 26. Moreover, an isolating unit 77 for magnetic isolation is additionally also provided. The magnetic ring unit 71 is used to measure the orientation or the rotational angle of the magnetorheological brake unit 1. The magnetic field sensor 72 is arranged inside the first brake component 2. Small relative axial displacements can additionally be used to detect pressing down, for example, of an operating button 101.

Figure 6E:
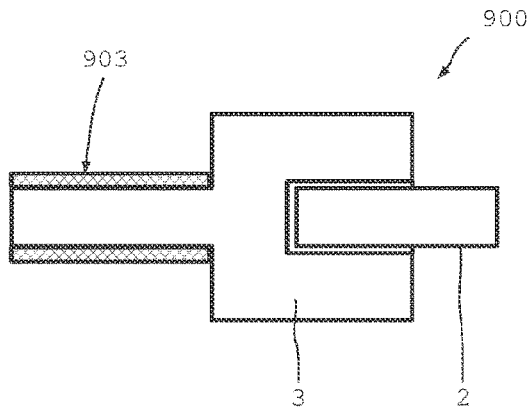

FIG. 6e shows a very schematic detail view of an operating device 900, in which the inner brake component 2 is embodied as fixed and is enclosed by the rotatable brake component 3. For this purpose, the brake component 3 can have a pin section and a hollow cylindrical section. The pin section can be grasped and rotated and corresponds to the operating element 903, while the brake function is implemented in the hollow cylindrical section. Such a design is possible in all embodiments.

Figure 7A:
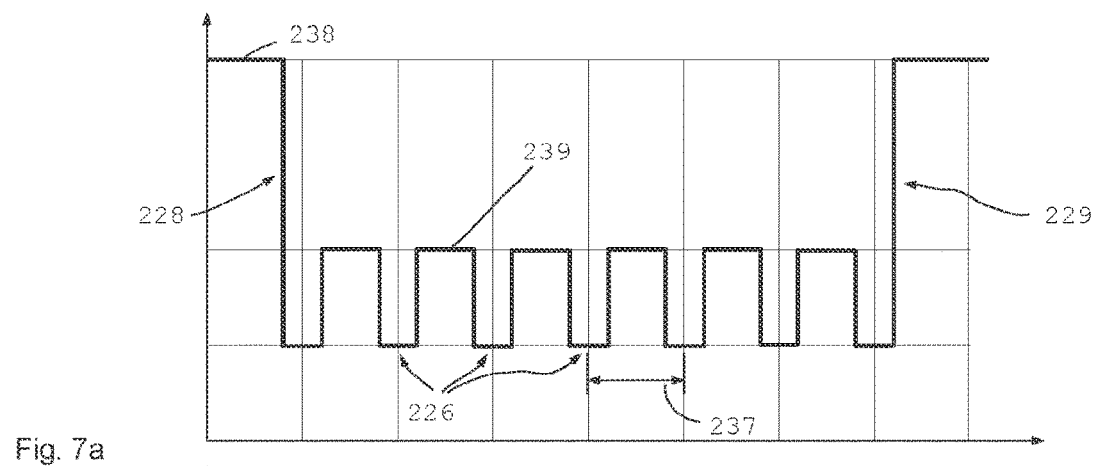
FIGS. 7a-7d show possible torque curves over the rotational angle of a brake unit.
Figure 7B:
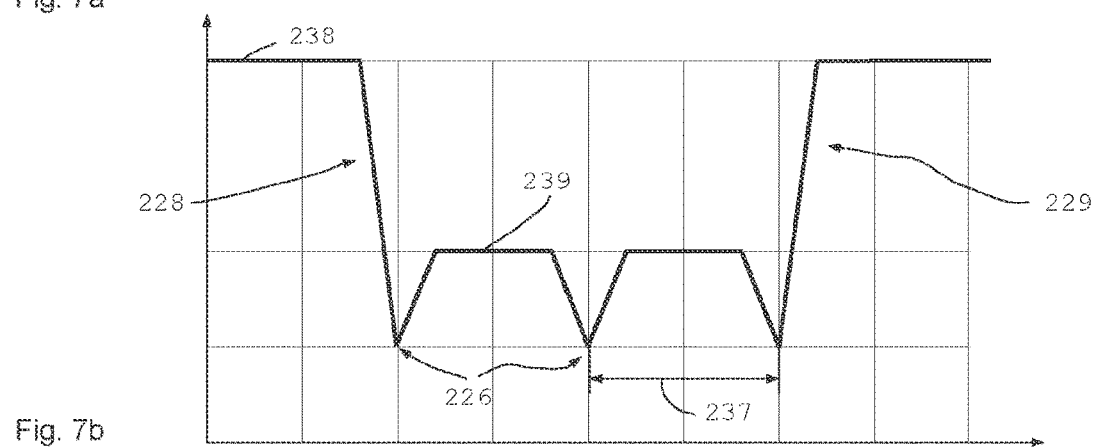
Figure 7C:
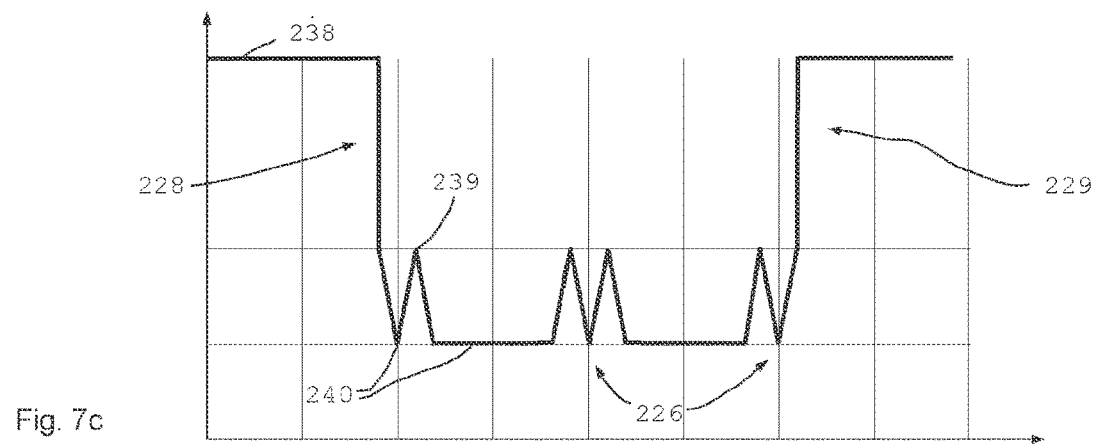

In FIGS. 7a, 7b, and 7c, possible embodiments for the control of a dynamically generated magnetic field or a dynamically generated braking torque as a function of the rotational angle are shown.

FIG. 7a shows the rotational resistance (torque) over the rotational angle of the operating element 903. A left end stop 228 and a right end stop 229 (elevated torque) can be generated using the control unit 27. Upon further rotation of the operating element 903, a high magnetic field or stop torque 238 is generated there, due to which the operating element 903 is opposed with a high resistance to a rotational movement. The user receives the haptic feedback of an end stop. A raster of the rotational movement can be produced or generated here. For example, this can be used to navigate a graphic menu and select menu points. A first raster point 226 is provided directly adjacent to the left end stop 228, which corresponds to a first menu point during operation, for example. If the next menu point is to be selected, the operating element 903 thus has to be rotated clockwise. For this purpose, the dynamically generated higher magnetic field or detent torque 239 or its friction torque has to be overcome before the next raster point 226 is reached. In FIG. 7*a*, a constant magnetic field is generated in each case for a certain angle range respectively at the raster points 226 and at regions located in between, which is significantly lower at the raster points than in the regions located in between and is once again significantly lower than at the stops 228, 229.

An angle interval 237 between individual raster points is dynamically variable and is adapted to the number of available raster points or menu points.

FIG. 7*b* shows a variant in which the magnetic field does not rise suddenly toward the end stops 228, 229, but rather takes a steep curve. Furthermore, ramped slopes of the magnetic field are provided at the raster points 226 in each case toward both rotational sides, due to which the rotational resistance increases in the corresponding rotational directions. Only three raster points 226 are made available here using the same operating element 903, the angle interval 237 of which is greater than in the example according to FIG. 7*a*.

FIG. 7*c* shows a variant in which a lower rotational resistance is present between individual raster points 226 and an elevated magnetic field 239 is only generated directly adjacent to each of the raster points 226, to enable snapping in at the individual raster points 226 and at the same time to only provide a low rotational resistance between individual raster points.

In principle, a mixture of the ways of operation and the magnetic field curves of FIGS. 7*a*, 7*b*, and 7*c* is also possible. For example, with different inputs and, for example, submenus, a correspondingly different setting of the magnetic field curve can take place.

Figure 7D:
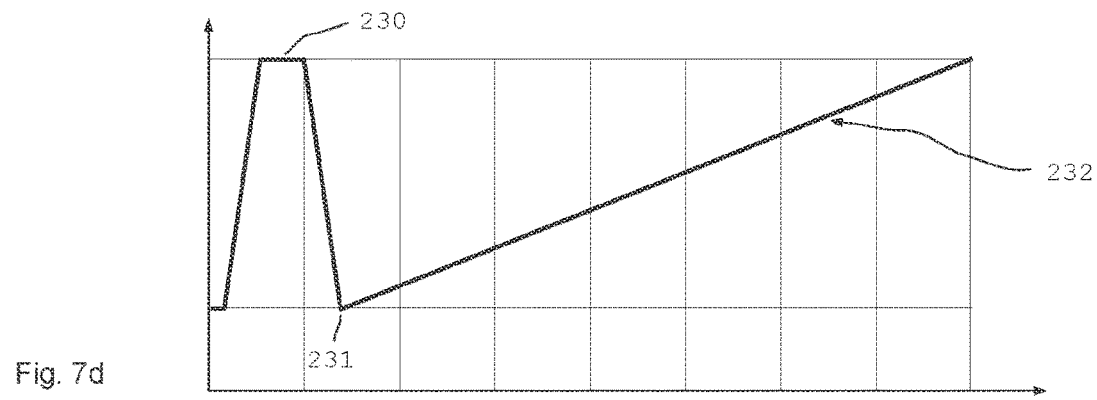

FIG. 7*d* shows the possible use in setting processes using the operating device 900 in the form of a curve. The operating element 903 can initially be rotated with low resistance, for example, minimal—or practically not at all. Subsequently, the required torque rises steeply or also suddenly up to the threshold 230. After overcoming the threshold 230, a function is started, e.g., a media playback, volume, or a selection menu. The rotational resistance sinks down to a relatively minimal torque 231. Immediately thereafter, the function of the operating element 903 is changed here. Upon further rotation, for example, a volume is changed or a menu is scrolled through. The required torque is increased linearly here according to the slope 232. It is also possible that the curve is not linear. It is also possible that from a specific volume or at the end of the menu, a steeper slope is set or the required torque is increased suddenly by a certain amount. This function can also be used, for example, when picking up the telephone (when telephoning via the computer using the operating element, or when the rotating wheel is installed differently, for example, in a steering wheel of an automobile, or in a smart phone). First, the user accepts the conversation in that he has to rotate the rotating knob beyond a torque threshold. The movement resistance then assumes a lower value again and the user can increase the volume by further rotation or reduce it by rotation in the opposite direction. Upon hanging up the telephone conversation, the same takes place in the reverse direction.

It is also possible in all cases that, for example, in a ripple (raster), it does not switch as heretofore between less and more amperage having the same polarization (thus, for example, +0.2 to +0.8 A=ripple), but rather alternately with changed polarization, i.e., from +0.2 to +0.8 A and then the next ripple with −0.2 A to −0.8 A and then the next torque peak from +0.2 to +0.8 A etc.

The preferably low-alloyed steel can contain a residual magnetic field. The steel is preferably demagnetized regularly or as needed (inter alia, by a special alternating field).

The material FeSi3P (silicon steel) or a material of a related type is preferably used for the components through which the magnetic field flows.

If the operating element 903 is not rotated, i.e., the angle is constant, the current is preferably continuously decreased over time. The current can also be varied in dependence on the velocity (rotational angular velocity of the operating element 903).

Within the system limits, arbitrary torque values can be assigned to the rotational angle (torque over rotational angle; Md over alpha).

Figure 8:
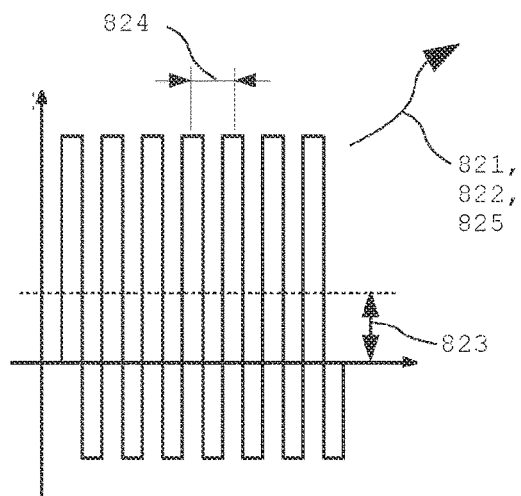
FIG. 8 shows a sketch of a current curve of the brake unit over time.

FIG. 8 shows a further embodiment variant of the control of the dynamically generated magnetic field or the dynamically generated brake torque. For this purpose, the amperage is plotted over the time here. The brake unit 1 is activated here using a current and/or voltage signal having a frequency 824 of, for example, 100 Hz or higher. Frequencies between 200 Hz and 1000 Hz are also possible and advantageous, for example. The sign of the frequency signal varies. A component of the positive and negative current flow is distributed asymmetrically 823 here. A user thus receives haptic feedback in the form of a clearly perceptible vibration 825 at the operating element 903. In addition, an audible tone 821 can be generated here by the corresponding high-frequency activation of the brake unit 1 during the rotation of the operating element 903. Thus, for example, a warning signal 822 or another notice can be output to the user. Depending on the selection of the frequency 824, the tone can be adapted and also varied over time so that, for example, a violin can be simulated.

Figure 9:
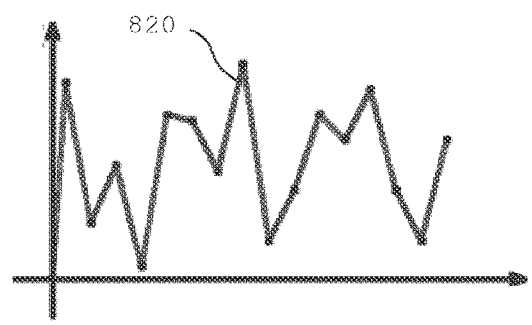
FIG. 9 shows a further sketch of a current curve of the brake unit over time.

FIG. 9 shows a further embodiment variant of the control of the dynamically generated magnetic field or the dynamically generated brake torque. For this purpose, the amperage is plotted over the time here. A random current signal 820 is applied to the brake unit 1 here. A user thus receives a particularly noticeable and unusual haptic feedback. The wear of a bearing or also sand in a transmission can thus be represented, for example.

Figure 10:
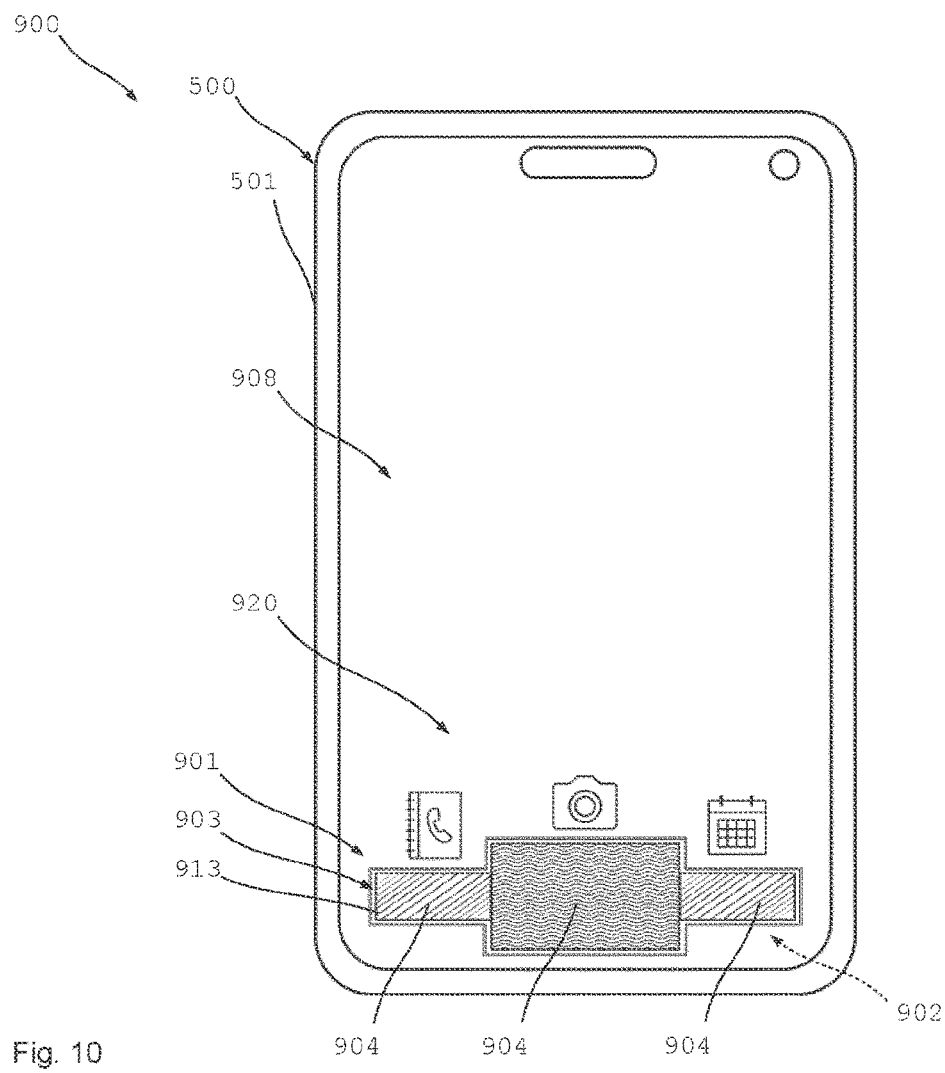
FIG. 10 shows a solely schematic illustration of an operating device in a top view.

FIG. 10 shows an exemplary use of the operating device 900 in a smart device 500 and, for example, smart phone. The smart device 500 has a graspable body 501 here, on which the receptacle part 902 is fastened, so that the operating element 903 can be rotated in relation to the body 501. The operating element 903 is designed here as a finger roller 913.

The actual function assignment of the actuating zones 904 is shown here by symbols in a display 908 of the smart device 500. Such symbols are shown here solely by way of example. If the operating device 900 is used in vehicles or in the case of the vehicle component 910, the symbols can be replaced by vehicle-specific symbols.

The selection of contacts is carried out in the present case here using the left actuating zone 904. The camera function can be activated and operated here using the middle actuating zone 904. The operation of a calendar function is carried out in the present case here using the right actuating zone 904. A targeted raster is provided here for each actuating zone 904.

Figure 11A:
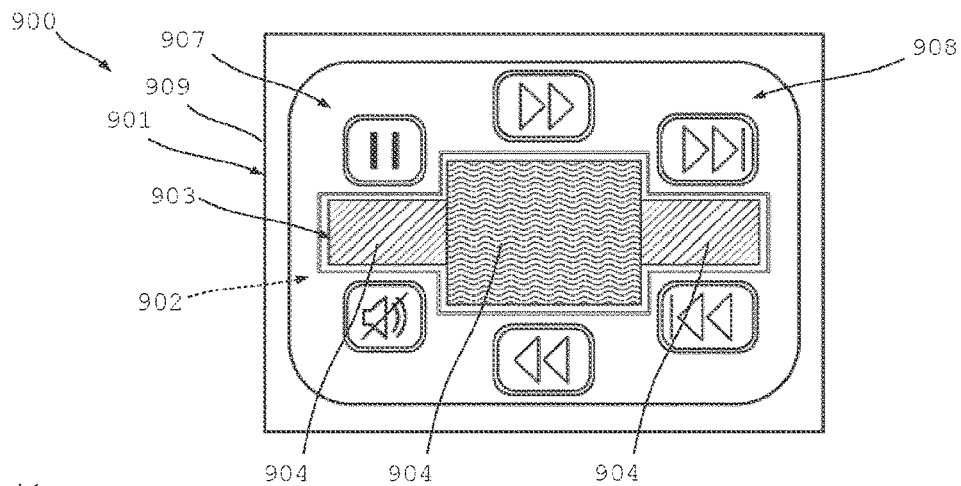
FIGS. 11a-11c show solely schematic illustrations of operating devices in a top view.
Figure 11B:
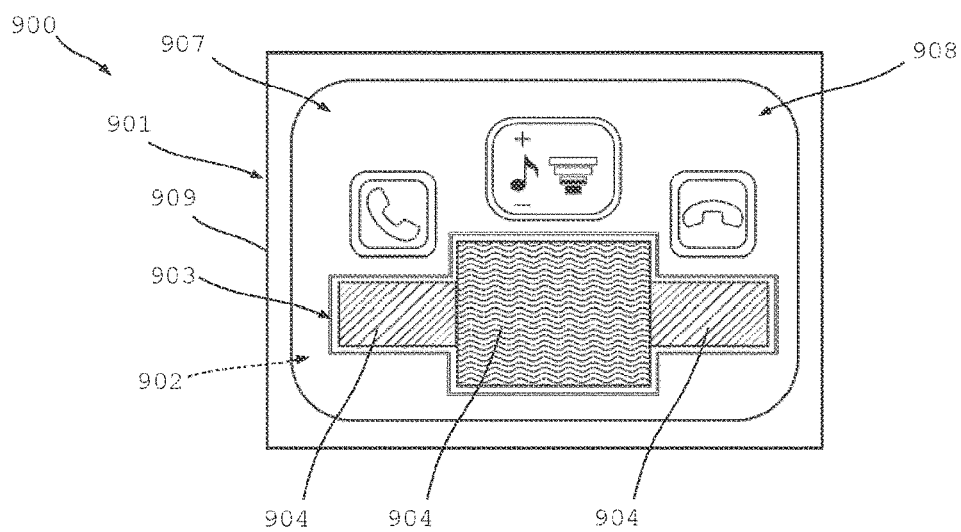
Figure 11C:
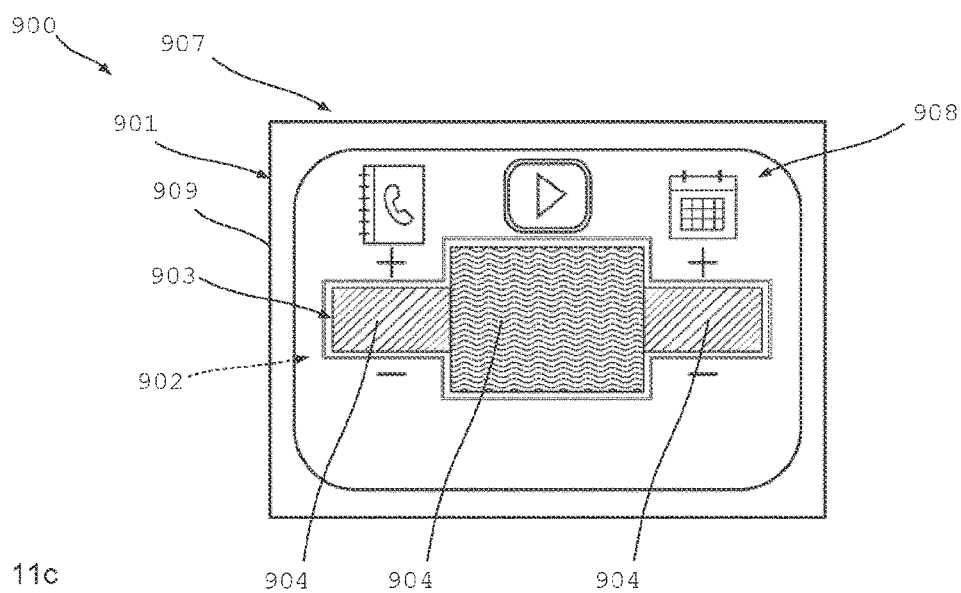

FIGS. 11*a* to 11*c* show exemplary applications of the operating device 900 according to the invention. The operating device 900 described with reference to FIG. 1*a* or 1*b* is used here, for example. The operating element 903 is designed here as a finger roller 913 and comprises three actuating zones 904.

The present function assignment of the actuating zones 904 is shown here by symbols in a display 908, which encloses the operating unit 901. Individual displays 908 can also be provided for the respective actuating zones 904. In FIG. 11*a*, a function assignment for the playback of media and, for example, music or videos is shown here.

A function assignment for telephoning is shown here in FIG. 11*b*. For this purpose, the operating device 900 can be coupled to a telecommunication unit 920. The acceptance of calls is carried out here using the left actuating zone 904. This actuating zone 904 can be illuminated automatically or the display can show the call symbol as soon a call arrives. This saves the often strongly distracting search for the correct button for call acceptance. This is advantageous, for example, in a rental car, where the positions of the buttons are often not known. The volume can be set here using the middle actuating zone 904. The ending of the telephone conversation is carried out here using the right actuating zone 904. A targeted raster is provided here for each actuating zone 904.

Figure 12:
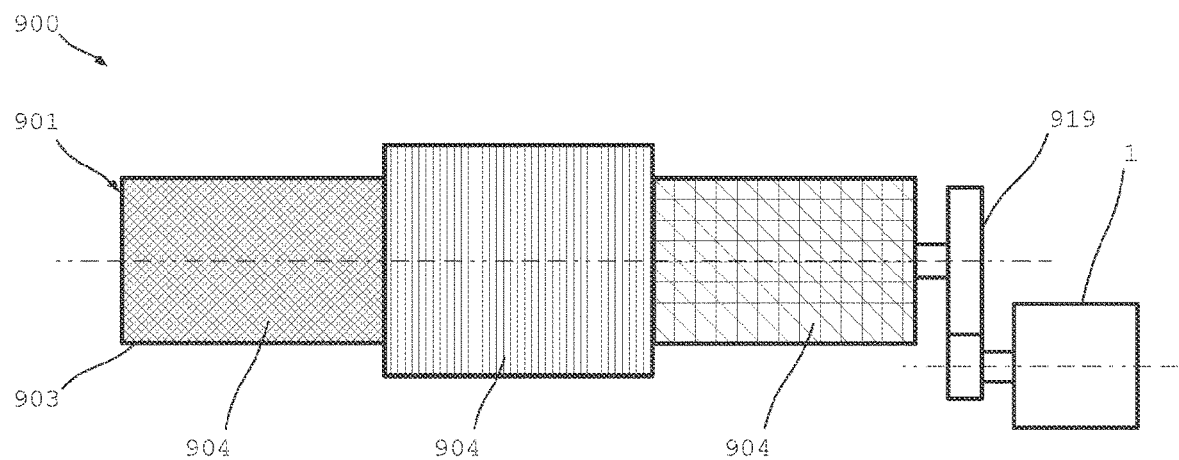
FIG. 12 shows a solely schematic illustration of the operating device having a transmission unit.

FIG. 12 shows in detail an operating device 900 as is described, for example, with reference to FIGS. 1*a* to 1*c*. The brake unit 1 is coupled here via a transmission unit 919 to the operating element 903. A higher (braking) torque can thus be achieved. Moreover, the transmission unit 919 bypasses the axes of rotation (sketched by dot-dash lines), which are arranged offset in parallel here, of operating element 903 and brake unit 1. A transmission unit 919 can also be provided for the other operating device 900 described here.

Figure 13:
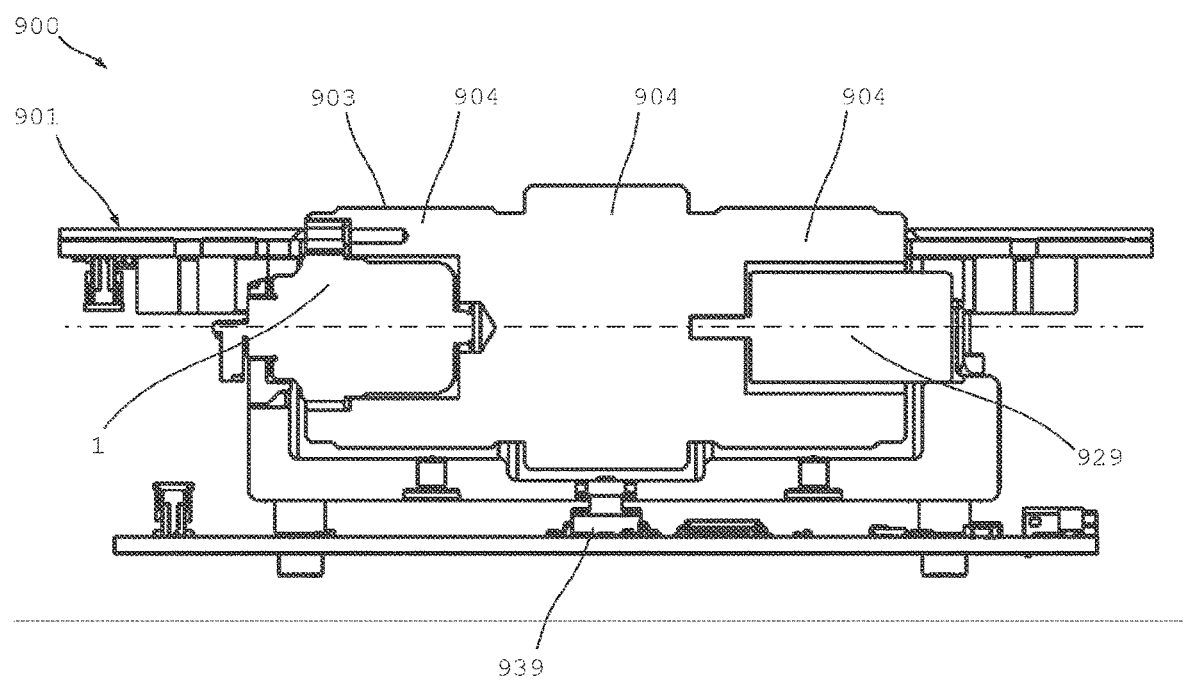
FIG. 13 shows a solely schematic illustration of an operating device having a drive unit in a sectional view.

An operating device 900 is shown in FIG. 13, in which the operating element 903 can also be actively rotated using a drive unit 929 in addition to the manual rotation. Such an active drive can advantageously be used for all operating devices 900 described here. The drive unit 929 is arranged here opposite to the brake unit 1 and has the same axis of rotation (sketched by dot-dash lines) as the operating element 903 and the brake unit 1. This enables particularly compact housing.

A switch unit 939, which can be actuated by pushing the operating element 903, can be seen well here. The switch unit 939 is equipped here with a pressure sensor. An input can thus take place in dependence on how strongly the operating element 903 is pressed on. The switch unit 939 can also be embodied as a switch without pressure sensor.

LIST OF REFERENCE SIGNS

1 brake unit
2 brake component
3 brake component
4 holder
5 gap, channel
5*a* gap width
6 medium
8 field
9 free distance
10 acute-angled region
11 transmission component, roller body, rotating body
11*d* arm
12 axis of rotation
13 rotating part
13*a* internal diameter
13*b* external diameter
13*c* height
13*d* wall thickness
13*e* sleeve part (lx drawing)
14 ball
15 cylinder
16 wedge shape
17 direction of the relative movement
18 direction of the relative movement
19 magnetic particles
20 axial direction
21 core
21*b* minimum diameter
24 outer ring
25 radial direction
26 coil
26*a* maximum diameter
26*c* coil plane
26*d* radial direction in relation to 26*c*
27 control unit
28 potting compound
30 bearing
32 transverse groove
33 main body
35 cable feedthrough
36 receptacle
36*a* external diameter
37 cylindrical running surface
37*a* external diameter
38 seal
43 user interface
45 cable
46 seal ring
48 slide guide
49 coating
50 bracket
61 angle segment
62 angle segment
63 receptacle for 11
64 outer surface
65 radial gap dimension
66 radial distance
67 inner surface of 13
68 signal
69 amplitude
70 sensor unit
71 magnetic ring unit
72 magnetic field sensor
73 sensor line
74 feeler
75 shielding unit
76 shielding body
77 isolating unit
78 decoupling unit
110 closed chamber
111 first end of 110
112 first bearing point
113 field generating unit
114 volume of 110
115 second end of the closed chamber 116 diameter of first bearing point
117 diameter of second bearing point
118 second bearing point
119 axle stub
120 compensation channel
121 end section of 2
122 radial direction (global)
226 raster point
228 end stop
229 end stop
230 threshold
231 minimum moment
232 slope
237 angle interval
238 stop torque
239 raster torque
240 base torque
500 smart device
501 body
820 current
821 warning tone
822 warning signal
823 asymmetry
824 frequency
825 vibration
900 operating device
901 operating unit
902 receptacle part
903 operating element
904 actuating zone
905 operating lever
906 rocker
907 monitoring unit
908 display
909 housing
910 vehicle component
913 finger roller
915 control stalk
916 rocker bearing
917 gesture recognition zone
919 transmission unit
920 telecommunication unit
923 rotating knob
929 drive unit
930 vehicle support structure
939 switch unit

The invention claimed is:

1. An input apparatus for carrying out inputs in an input receiving unit to be coupled to the input apparatus, the input apparatus comprising:
an operating unit having a receptacle part and at least one operating element rotatably mounted to said receptacle part for movement by a finger to carry out an input;
said operating element having at least two actuating zones;
a controlled brake unit configured to adjust a movement resistance for a mobility of said operating element, the movement resistance for the mobility of said operating element being adjustable in dependence on the actuating zone from which said operating element is actuated and/or which actuating zone was previously activated
a rotational movement of said operating element being configured to be subjected to a settable raster and the raster being generated by a deliberate deceleration or blocking and a deliberate release of the rotational movement in specific time intervals or at specific rotational angles, and the raster also being set in dependence on said actuating zone from which said operating element is actuated (rotated).

2. The input apparatus according to claim 1, wherein the movement resistance for the mobility of said operating element is a torque for a rotatability of said operating element and/or a resistance force for a linear movement of said operating element.

3. The input apparatus according to claim 1, wherein said brake unit is a magnetorheological device and contains magnetorheological medium and a field generating unit for generating and controlling a magnetic or electrical field, and wherein said medium is influenced by said field generating unit to set the movement resistance for the rotatability of said operating element.

4. The input apparatus according to claim 1, wherein said actuating zones are connected to one another and rotationally fixed and/or said actuation zones have a common axis of rotation.

5. The input apparatus according to claim 1, wherein the movement resistance for the mobility of said operating element is adjustable in dependence on a rotational angle of said operating element detected by at least one sensor unit and deliberately adapted to the rotational angle.

6. The input apparatus according to claim 1, which comprises a monitoring unit for detecting by sensor from which actuating zone the actuation takes place and/or wherein said actuating zones are activatable by at least one of touch or push.

7. The input apparatus according to claim 1, wherein said actuating zones are haptically distinguishable and have mutually different features selected from the group consisting of a different surface, a different surface structure, a different size, a different geometry, a different color, and a different material.

8. The input apparatus according to claim 1, wherein said actuating zones include illumination and are configured to be illuminated differently, so that said actuating zones are optically distinguishable by the illumination, and wherein an active actuating zone may be illuminated differently from a currently non-selected actuating zone.

9. The input apparatus according to claim 8, configured for coupling to a telecommunication unit for operating the telecommunication unit by way of said operating unit, and wherein at least one of said actuating zones is illuminated to indicate an incoming call, and wherein the incoming call can be accepted using the respectively illuminated actuating zone.

10. The input apparatus according to claim 1, further comprising a control unit configured to activate said brake unit in dependence on at least one control command and to convert the control command into a haptic signal perceptible at said operating element to convey to a user haptic feedback at said operating element as a consequence of an input.

11. The input apparatus according to claim 10, wherein the haptic feedback is effected in dependence on the actuating zone in which said operating element is actuated or touched.

12. The input apparatus according to claim 1, wherein a specific input is associated with the respectively actuated actuating zone, and wherein an assignment of an actuating zone to an input is programmable and/or dynamically adaptable.

13. The input apparatus according to claim 1, wherein a rotatability of said operating element is settable by said brake unit in between a freely rotatable setting and a complete block of a force that is manually generated by operation at said operating element.

14. The input apparatus according to claim 1, wherein said operating element is mounted for a movement by pushing, pulling, or lateral movement to carry out an input.

15. The input apparatus according to claim 1, wherein said operating element is a finger roller.

16. The input apparatus according to claim 1, wherein said operating element is a rotating knob.

17. A vehicle component for carrying out inputs in an input receiving unit of a motor vehicle, the vehicle component comprising:
at least one operating unit according to claim 1 having the receptacle part mounted on a vehicle support structure.

18. The vehicle component according to claim 17, wherein at least one input receiving unit is operable using the operating unit, said receiving unit being selected from the group consisting of display, instruments, volume control, telephone, telecommunication system, driver assistance systems, cruise control, adaptive cruise control, side assist, turn signal, windshield wipers, horn, vehicle illumination for exterior and interior, seat functions, mirror unit, sliding roof, flashing hazard lights, start and stop system of the vehicle, climate control functions, ventilation, window lifters, and actuating units for closing or opening doors or vehicle hatches.

19. A method of operating an input apparatus, the method which comprises:
providing an input apparatus according to claim 1;
moving an operating element of the input apparatus by at least one finger to carry out an input; and
adjusting a movement resistance for a mobility of the operating element in dependence on an actuating zone from which the operating element is actuated and/or which actuating zone was previously activated.

20. The method according to claim 19, which comprises indicating an assignment of the actuating zones by using at least one signal selected from the group consisting of a haptic signal, and optical signal, and an acoustic signal, to thereby indicate which function can presently be operated using a specific actuating zone.

21. An input apparatus for carrying out inputs in an input receiving unit to be coupled to the input apparatus, the input apparatus comprising:
an operating unit having a receptacle part and at least one operating element rotatably mounted to said receptacle part for movement by a finger to carry out an input;
said operating element having at least two actuating zones;
a controlled brake unit configured to adjust a movement resistance for a mobility of said operating element, the movement resistance for the mobility of said operating element being adjustable in dependence on the actuating zone from which said operating element is actuated and/or which actuating zone was previously activated; and
said operating element being a rocker with a rocker bearing between at least two actuating zones, said operating element being configured to be pressed to both sides of said rocker bearing for effecting an input and a specific input takes place depending on the pressed actuating zone.

22. An input apparatus for carrying out inputs in an input receiving unit to be coupled to the input apparatus, the input apparatus comprising:
an operating unit having a receptacle part and at least one operating element rotatably mounted to said receptacle part for movement by a finger to carry out an input;
said operating element having at least two actuating zones;
a controlled brake unit configured to adjust a movement resistance for a mobility of said operating element, the movement resistance for the mobility of said operating element being adjustable in dependence on the actuating zone from which said operating element is actuated and/or which actuating zone was previously activated; and
a pivotable operating lever carrying said receptacle part, said operating element being movable independently of said operating lever and said operating unit also being moved upon pivoting of the operating lever.

* * * * *